(12) United States Patent
Gaevski et al.

(10) Patent No.: US 10,950,747 B2
(45) Date of Patent: Mar. 16, 2021

(54) HETEROSTRUCTURE FOR AN OPTOELECTRONIC DEVICE

(71) Applicant: Sensor Electronic Technology, Inc., Columbia, SC (US)

(72) Inventors: Mikhail Gaevski, Columbia, SC (US); Alexander Dobrinsky, Silver Spring, MD (US); Maxim S. Shatalov, Columbia, SC (US); Michael Shur, Vienna, VA (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 16/012,943

(22) Filed: Jun. 20, 2018

(65) Prior Publication Data
US 2018/0315886 A1 Nov. 1, 2018

Related U.S. Application Data

(63) Continuation-in-part of application No. 15/200,575, filed on Jul. 1, 2016, now Pat. No. 10,050,172.
(Continued)

(51) Int. Cl.
*H01L 33/00* (2010.01)
*H01L 33/06* (2010.01)
(Continued)

(52) U.S. Cl.
CPC ...... *H01L 33/0075* (2013.01); *H01L 21/6835* (2013.01); *H01L 33/007* (2013.01);
(Continued)

(58) Field of Classification Search
None
See application file for complete search history.

(56) References Cited

U.S. PATENT DOCUMENTS 6,924,159 B2 * 8/2005 Usui .................. C30B 29/403
438/22
7,754,511 B2 7/2010 Wen et al.
(Continued)

FOREIGN PATENT DOCUMENTS

KR 1020140026069 A 3/2014
WO 2015077779 A1 5/2015

OTHER PUBLICATIONS

Tynes Jr., U.S. Appl. No. 15/200,575, Notice of Allowance, dated Apr. 16, 2018, 9 pages.
(Continued)

*Primary Examiner* — Zandra V Smith
*Assistant Examiner* — Lawrence C Tynes, Jr.
(74) *Attorney, Agent, or Firm* — LaBatt, LLC

(57) ABSTRACT

A heterostructure, such as a group III nitride heterostructure, for use in an optoelectronic device is described. The heterostructure can include a sacrificial layer, which is located on a substrate structure. The sacrificial layer can be at least partially decomposed using a laser. The substrate structure can be completely removed from the heterostructure or remain attached thereto. One or more additional solutions for detaching the substrate structure from the heterostructure can be utilized. The heterostructure can undergo additional processing to form the optoelectronic device.

12 Claims, 17 Drawing Sheets

Related U.S. Application Data

(60) Provisional application No. 62/187,707, filed on Jul. 1, 2015, provisional application No. 62/522,251, filed on Jun. 20, 2017.

(51) Int. Cl.
  *H01L 33/32* (2010.01)
  *H01S 5/343* (2006.01)
  *H01S 5/32* (2006.01)
  *H01L 33/02* (2010.01)
  *H01L 21/683* (2006.01)
  *H01L 21/02* (2006.01)

(52) U.S. Cl.
  CPC .......... *H01L 33/0093* (2020.05); *H01L 33/02* (2013.01); *H01L 33/06* (2013.01); *H01L 33/32* (2013.01); *H01S 5/3209* (2013.01); *H01S 5/34333* (2013.01); *H01L 21/0242* (2013.01); *H01L 21/0254* (2013.01); *H01L 21/02458* (2013.01); *H01L 21/02664* (2013.01); *H01L 2221/68368* (2013.01); *H01L 2221/68381* (2013.01)

(56) References Cited

U.S. PATENT DOCUMENTS

| | | | |
|---|---|---|---|
| 8,154,034 B1 | 4/2012 | Zhang et al. | |
| 8,787,418 B2 | 7/2014 | Shur et al. | |
| 8,937,295 B2* | 1/2015 | Lowgren | H01L 33/18 257/13 |
| 9,246,311 B1* | 1/2016 | Raring | H01S 5/0218 |
| 9,281,441 B2 | 3/2016 | Shur et al. | |
| 2002/0171087 A1* | 11/2002 | Krames | H01L 33/62 257/81 |
| 2003/0231683 A1* | 12/2003 | Chua | B82Y 20/00 372/46.01 |
| 2006/0160334 A1* | 7/2006 | Park | H01L 21/02458 438/479 |
| 2007/0072396 A1* | 3/2007 | Feltin | C30B 25/02 438/478 |
| 2007/0101932 A1* | 5/2007 | Schowalter | H01L 29/2003 117/84 |
| 2007/0139141 A1* | 6/2007 | Knollenberg | H03H 9/172 333/191 |
| 2007/0206267 A1* | 9/2007 | Tung | B81B 3/001 359/291 |
| 2008/0073743 A1* | 3/2008 | Alizadeh | B82Y 30/00 257/461 |
| 2009/0218587 A1* | 9/2009 | Harle | H01L 33/0095 257/99 |
| 2010/0230711 A1* | 9/2010 | Kuo | H01L 27/156 257/99 |
| 2011/0132549 A1 | 6/2011 | Sercel et al. | |
| 2011/0215352 A1* | 9/2011 | Jeong | H01L 33/44 257/94 |
| 2012/0061728 A1* | 3/2012 | Javey | H01L 29/78681 257/192 |
| 2012/0299038 A1* | 11/2012 | Hwang | H01L 33/32 257/98 |
| 2013/0264598 A1* | 10/2013 | Hertkorn | H01L 33/0093 257/98 |
| 2013/0280885 A1* | 10/2013 | Bayram | H01L 21/6835 438/458 |
| 2013/0299858 A1* | 11/2013 | Kar | H01L 33/40 257/98 |
| 2014/0054633 A1* | 2/2014 | Kim | H01L 33/58 257/98 |
| 2014/0225186 A1* | 8/2014 | Abou-Khalil | H01L 29/66704 257/330 |
| 2014/0346441 A1 | 11/2014 | Shur et al. | |
| 2015/0048309 A1 | 2/2015 | Shur et al. | |
| 2015/0069418 A1* | 3/2015 | Heo | H01L 21/02664 257/79 |
| 2015/0091043 A1 | 4/2015 | Shur et al. | |
| 2015/0091175 A1* | 4/2015 | Chandhok | H01L 21/7682 257/773 |
| 2015/0108428 A1 | 4/2015 | Shatalov et al. | |
| 2015/0229108 A1 | 8/2015 | Steigerwald et al. | |
| 2015/0239063 A1* | 8/2015 | Martinsen | B23K 26/0006 219/121.73 |
| 2015/0243841 A1 | 8/2015 | Shatalov et al. | |
| 2015/0255672 A1 | 9/2015 | Shur et al. | |
| 2015/0364319 A1* | 12/2015 | Park | H01L 21/3086 257/615 |
| 2017/0005224 A1 | 1/2017 | Shur et al. | |

OTHER PUBLICATIONS

Tynes Jr., U.S. Appl. No. 15/200,575, Non-Final Rejection2, dated Aug. 2, 2017, 16 pages.
Tynes Jr., U.S. Appl. No. 15/200,575, Non-Final Rejection1, dated Jan. 12, 2017, 17 pages.
Choi, S., International Application No. PCT/US2016/040656, International Search Report and Written Opinion, dated Oct. 20, 2016, 14 pages.
Delmdahl, R., et al., "Large-area laser-lift-off processing in microelectronics," SciVerse ScienceDirect, 2013, 8 pages.
Tynes, Jr., U.S. Appl. No. 16/101,646, Office Action 1, dated Aug. 22, 2019, 11 pages.
Kim, J.J., Application No. 10-2018-70032383, Office Action 1, dated Mar. 7, 2019, 17 pages.
Tynes, Jr., U.S. Appl. No. 16/101,646, Notice of Allowance, dated Apr. 3, 2020, 9 pages.

* cited by examiner

Sapphire thinning

HETEROSTRUCTURE FOR AN OPTOELECTRONIC DEVICE

REFERENCE TO RELATED APPLICATIONS

The current application is a continuation-in-part of U.S. patent application Ser. No. 15/200,575, filed on 1 Jul. 2016, which claims the benefit of U.S. Provisional Application No. 62/187,707, which was filed on 1 Jul. 2015, each of which is hereby incorporated by reference. The current application also claims the benefit of U.S. Provisional Application No. 62/522,251, which was filed on 20 Jun. 2017, which is hereby incorporated by reference.

TECHNICAL FIELD

The disclosure relates generally to semiconductor fabrication, and more particularly, to laser-based removal of a substrate structure.

BACKGROUND ART

Substrates including one or more epitaxially grown group III nitride semiconductor layers are frequently used for fabricating a wide variety of semiconductor structures and devices including, for example, integrated circuit (IC) devices (for example, logic processors and memory devices), radiation-emitting devices (for example, light emitting diodes (LEDs), resonant cavity light-emitting diodes (RCLEDs), vertical cavity surface emitting lasers (VCSELs), laser diodes), radiation sensing devices (for example, optical sensors), and electronic devices utilized in power control systems.

For growing group III nitride semiconductor structures, lattice mismatch substrates are typically used as it is currently expensive to produce high quality bulk semiconductor substrates such as bulk GaN and bulk AlN substrates. In many instances, sapphire is used as a lattice mismatched substrate. Other substrates include semiconductor materials such as, for example, silicon (Si), silicon carbide (SiC), III-V type semiconductor materials, and other substrates known in the art.

Individual semiconductor structures (e.g., dies or wafers) may be relatively thin and difficult to handle with equipment for processing the semiconductor structures. Thus, so-called "carrier" dies or wafers may be attached to the actual semiconductor structures including the active and passive components of operative semiconductor devices. The carrier dies or wafers do not typically include any active or passive components of a semiconductor device to be formed. Such carrier dies and wafers are referred to herein as "carrier substrates." The carrier substrates increase an overall thickness of the semiconductor structures and facilitate handling of the semiconductor structures (e.g., by providing structural support to the relatively thinner semiconductor structures) by processing equipment used to process the active and/or passive components in the semiconductor structures attached thereto that will include the active and passive components of a semiconductor device to be fabricated thereon.

Laser lift-off may be used to separate portions of substrates during the fabrication of semiconductor structures. For example, in an illustrative approach, an epitaxial layer may be grown on a first substrate, and individual chips may be formed in the epitaxial layer. A second substrate may be bonded to the epitaxial layer. A laser heats the first substrate and releases it from the epitaxial layer. The individual chips remain attached to the second substrate.

SUMMARY OF THE INVENTION

Aspects of the invention provide a solution for fabricating a heterostructure, such as a group III nitride heterostructure, for use in an optoelectronic device. The heterostructure can be epitaxially grown on a sacrificial layer, which is located on a substrate structure. The sacrificial layer can be at least partially decomposed using a laser. The substrate structure can be completely removed from the heterostructure or remain attached thereto. One or more additional solutions for detaching the substrate structure from the heterostructure can be utilized. The heterostructure can undergo additional processing to form the optoelectronic device.

A first aspect of the invention provides a method of fabricating a group III nitride heterostructure, the method comprising: epitaxially growing a sacrificial layer over a substrate structure; epitaxially growing the group III nitride heterostructure directly on the sacrificial layer; and decomposing the sacrificial layer by irradiating the sacrificial layer with a laser to at least partially release the group III nitride heterostructure from the substrate structure.

A second aspect of the invention provides a method of fabricating an optoelectronic device, the method comprising: epitaxially growing a sacrificial layer over a substrate structure; epitaxially growing the group III nitride heterostructure directly on the sacrificial layer, wherein the group III nitride heterostructure includes an active region for the optoelectronic device; and decomposing the sacrificial layer by irradiating the sacrificial layer with a laser to at least partially release the group III nitride heterostructure from the substrate structure.

A third aspect of the invention provides a method of fabricating an optoelectronic device, the method comprising: epitaxially growing a sacrificial layer over a substrate structure; epitaxially growing the group III nitride heterostructure directly on the sacrificial layer, wherein the group III nitride heterostructure includes an active region for the optoelectronic device; and at least partially decomposing the sacrificial layer by irradiating the sacrificial layer with a laser to at least partially release the group III nitride heterostructure from the substrate structure.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 5A and 5B show an illustrative process for growing columnar structures according to an embodiment, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
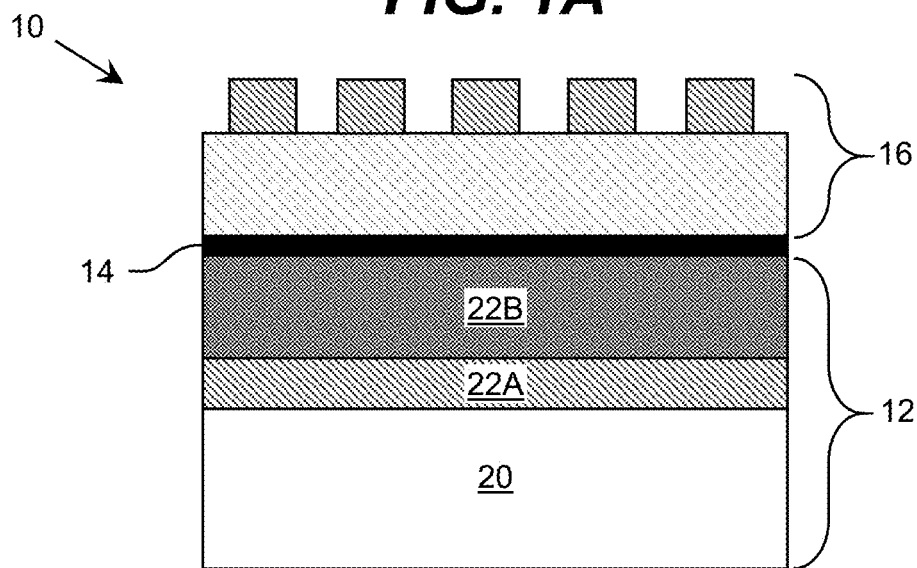
FIGS. 1A and 1B illustrate fabrication of a group III nitride heterostructure according to an embodiment.

As indicated above, aspects of the invention provide a solution for fabricating a heterostructure, such as a group III nitride heterostructure, for use in an optoelectronic device. The heterostructure can be epitaxially grown on a sacrificial layer, which is located on a substrate structure. The sacrificial layer can be at least partially decomposed using a laser. The substrate structure can be completely removed from the heterostructure or remain attached thereto. One or more additional solutions for detaching the substrate structure from the heterostructure can be utilized. The heterostructure can undergo additional processing to form the optoelectronic device.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. Unless otherwise stated, two values are "similar" when the smaller value is within +/− twenty-five percent of the larger value. A value, y, is on the order of a stated value, x, when the value y satisfies the formula $0.1x \leq y \leq 10x$.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Embodiments described herein can be directed to fabrication of a group III nitride-based device, which includes one or more active layers formed of a group III nitride material. Group III nitride materials comprise one or more group III elements (e.g., boron (B), aluminum (Al), gallium (Ga), and indium (In)) and nitrogen (N), such that $B_wAl_xGa_yIn_zN$, where $0 \leq w, x, y, z \leq 1$, and $w+x+y+z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

While illustrative aspects of the invention are described in conjunction with group III nitride heterostructures, it is understood that embodiments of the invention can be utilized in conjunction with the fabrication of various types of devices using heterostructures formed using other materials. For example, embodiments can be directed to devices fabricated using another type of group III-V material, such as devices fabricated using group III arsenide materials, group III phosphide materials, and/or the like. When utilized in conjunction with heterostructures formed with materials other than group III nitride materials, it is understood that one or more variations may be required, such as use of different parameters, selection of different materials, and/or the like.

Figure 1B:
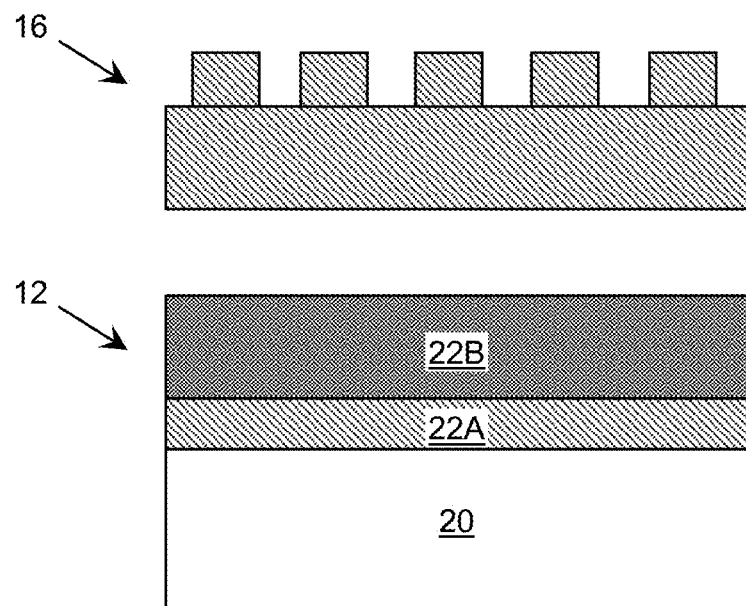

Turning to the drawings, FIGS. 1A and 1B illustrate fabrication of a group III nitride heterostructure 16 according to an embodiment. As illustrated in FIG. 1A, the group III nitride heterostructure 16 can be fabricated as part of a growth structure 10, which includes a substrate structure 12, a sacrificial layer 14 directly on the substrate structure 12, and the group III nitride heterostructure 16 directly on the sacrificial layer 14. Subsequently, as illustrated in FIG. 1B, the sacrificial layer 14 can be decomposed, leaving two separate structures, the group III nitride heterostructure 16 and the substrate structure 12. This process can be referred to as releasing the group III nitride heterostructure 16, lift-off of the group III nitride heterostructure 16, and/or the like. The group III nitride heterostructure 16 can be further processed to fabricate a set of group III nitride-based optoelectronic devices. In an embodiment, the substrate structure 12 can be processed (e.g., cleaned) and reused for subsequent fabrication of one or more additional group III nitride heterostructures 16.

In an embodiment, the group III nitride heterostructure 16 includes some or all of the layers of a heterostructure for fabricating a corresponding optoelectronic device. In an embodiment, the optoelectronic device is configured to operate as an emitting device, such as a light emitting diode (LED), e.g., a conventional or super luminescent LED, or a laser diode (LD), a light emitting solid state laser, and/or the like. However, it is understood that the device can be another type of device, such as a photo-detector, a photodiode, a high-electron mobility transistor (HEMT), or another type of optoelectronic device.

When the optoelectronic device is operated as an emitting device, application of a bias comparable to the band gap results in the emission of electromagnetic radiation from an active region of the optoelectronic device. The electromagnetic radiation emitted (or sensed) by the optoelectronic device can have a peak wavelength within any range of wavelengths, including visible light, ultraviolet radiation, deep ultraviolet radiation, infrared light, and/or the like. In an embodiment, the device is configured to emit (or sense) radiation having a dominant wavelength within the ultraviolet range of wavelengths. In a more specific embodiment, the dominant wavelength is within a range of wavelengths between approximately 210 and approximately 360 nanometers.

The growth structure 10 can be fabricated using any solution. In an embodiment, fabrication of the growth structure 10 initially includes epitaxially growing a set of group III nitride layers 22A, 22B directly on a substrate 20. The substrate 20 can comprise any type of substrate suitable for use in a process described herein. In an illustrative embodiment, the substrate 20 is sapphire. However, it is understood that the substrate 20 can be formed of any suitable material including, for example, silicon carbide (SiC), silicon (Si), bulk GaN, bulk AlN, bulk or a film of AlGaN, bulk or a film of BN, AlON, LiGaO2, LiAlO2, aluminum oxinitride (AlOxNy), MgAl2O4, GaAs, Ge, or another suitable material.

The substrate structure 12 can include any number of group III nitride layers, which can be designed to promote high quality growth of the subsequent layers in the group III nitride heterostructure 16. To this extent, while the substrate structure 12 is shown including two group III nitride layers 22A, 22B, it is understood that embodiments of the substrate structure 12 can include fewer or more group III nitride layers. In a further embodiment, a substrate structure 12 without any group III nitride layers can be utilized in a process described herein. Regardless, when included, the group III nitride layers 22A, 22B can comprise, for example, a nucleation layer 22A and a buffer layer 22B. Each of the nucleation layer 22A and the buffer layer 22B can be composed of any suitable material, such as a group III nitride material. Illustrative group III nitride materials include AlN, an AlGaN/AlN superlattice, and/or the like. In another embodiment, the layer 22A comprises a buffer layer and layer 22B comprises a transition layer. In this case, the layer 22A can be composed of AlN, while the layer 22B can be composed of $Al_w In_x B_y Ga_z N$, where $0 \le w, x, y, z \le 1$, and $w+x+y+z=1$. When the group III nitride heterostructure 16 is configured for fabrication of an ultraviolet light emitting diode, the layer 22B can be AlN and have a thickness chosen to minimize a number of dislocations in the layers of the group III nitride heterostructure 16. For example, the thickness of the layer 22B can be between 1-10 micrometers.

The sacrificial layer 14 can be epitaxially grown directly on the substrate structure 12, e.g., a surface of the layer 22B. The sacrificial layer 14 can be of any suitable material that decomposes when irradiated by a laser. In an embodiment, the sacrificial layer 14 is formed of a group III nitride material. For example, the sacrificial layer 14 can be formed of a group III nitride semiconductor material having a bandgap value lower than a bandgap value of any layer in the substrate structure 12. In an embodiment, the change in the bandgap value results in at least an order of magnitude increased absorption of the irradiated laser light by the sacrificial layer 14 as compared to any semiconductor layer in the substrate structure 12. In an embodiment, the sacrificial layer 14 is formed of GaN and each group III nitride semiconductor layer 22A, 22B in the substrate structure 12 has an aluminum molar fraction of at least 0.5. In a more particular embodiment, the group III nitride semiconductor layer 22B immediately adjacent to the sacrificial layer 14 is AlN.

A thickness (in the growth direction) of the sacrificial layer 14 can be configured to result in stresses and strains within the sacrificial layer 14 that are high, but do not significantly alter the number of dislocations present in the semiconductor layer grown above the sacrificial layer 14 (e.g., the first layer in the group III nitride heterostructure 16). In an embodiment, a thickness of the sacrificial layer 14 is selected to reduce a number of dislocations within the following semiconductor layer. In an illustrative embodiment, such a thickness is between 10 nanometers and 500 nanometers. A substantially optimal thickness for the sacrificial layer 14 can be determined, for example, by growing sacrificial layers with differing thicknesses and determining a minimum thickness leading to an onset of dislocation formation. The sacrificial layer 14 can be grown to a thickness approximately ten percent less than the minimum thickness determined. The sacrificial layer 14 thickness and composition can be configured such that most of the intensity of the laser beam used during lift-off is absorbed by the sacrificial layer 14. In an embodiment, the thickness of the sacrificial layer 14 is selected to be at least one absorption length for a corresponding laser beam to be used for the lift-off, where an absorption length is a length in which an intensity of the radiation is decreased by a factor of exp(1) throughout the thickness of the sacrificial layer 14.

In a more particular embodiment, the group III nitride semiconductor layer 22B is an aluminum nitride layer and the sacrificial layer 14 forms a sharp composition interface therewith. Additionally, the first semiconductor layer in the heterostructure 16 can be an n-type doped group III nitride semiconductor layer that is at least one micron thick. In a more particular embodiment, the first semiconductor layer in the heterostructure 16 (immediately adjacent to the sacrificial layer) is $Al_x Ga_{1-x} N$, where $0<x<1$. Additionally, the sacrificial layer 14 can comprise $Al_{x1} Ga_{1-x1} N$, where $x1<x$. In another embodiment, the sacrificial layer 14 can comprise $Al_x In_y B_z Ga_{1-x-y-z} N$, where $0 \le x, y, z \le 1$ and $0 \le 1-x-y-z \le 1$.

An embodiment of the sacrificial layer 14 can include alternating sub-layers, which are configured to have alternating tensile and compressive stresses. The tensile and compressive sub-layers can be obtained by, for example, varying a V-III precursor ratio used during epitaxial growth of the sacrificial layer 14. It is understood that other growth parameters (e.g., time, temperature, pressure, and/or the like) can be varied to induce changes in the lattice structure of the sacrificial layer 14 and/or for inducing internal stresses within the sacrificial layer 14, which can be particularly useful for improving the lift-off process using the sacrificial layer 14. For example, an embodiment of the sacrificial layer 14 can be heavily doped to induce point defects and other defects therein, which can induce ablation through joule heating.

Figure 2A:
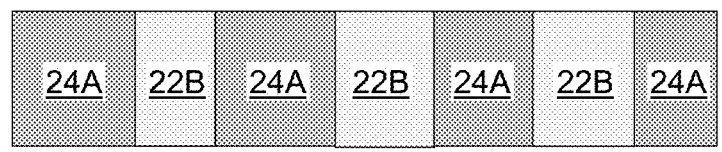
FIGS. 2A and 2B show illustrative sacrificial layers with laterally varying compositions according to embodiments.
Figure 2B:
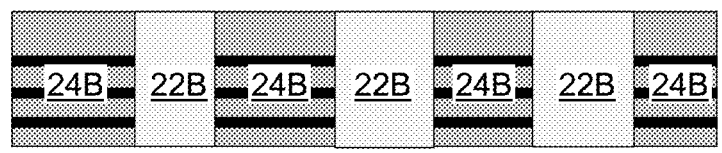

FIGS. 2A and 2B show illustrative sacrificial layers 14A, 14B, each of which can be implemented as the sacrificial layer 14 in the growth structure 10 shown in FIG. 1, according to embodiments. In FIG. 2A, the sacrificial layer 14A has a composition that varies laterally. For example, the sacrificial layer 14A can include a set of first composition regions 24A alternating with a set of second composition regions 22B. In an embodiment, the set of second composition regions 22B are formed from a topmost portion of the group III nitride semiconductor layer 22B in the substrate structure 12. In this case, the layer 22B can be grown and the surface subsequently patterned to form a set of openings in the layer 22B for subsequent growth of the set of first composition regions 24A directly thereon. Alternatively, the second composition regions 22B can be formed of a masking material, such as silicon dioxide, which can be readily chemically etched. The patterning can include, for example, applying a masking material over regions defining the pattern, and etching the unmasked portions to form the set of openings. The openings can extend any distance into the layer 22B. For example, the distance can be determined using the approach described herein with respect to the thickness of the sacrificial layer 14.

The set of first composition regions 24A can comprise any suitable type of group III nitride material. For example, a first composition region 24A can be formed of GaN. In the embodiment shown in FIG. 2B, a first composition region 24B can be formed of alternating sublayers of group III nitride materials. The sublayers can form a superlattice designed to induce a large stress within the sacrificial layer 14B. The stress can be induced by epitaxially growing lattice mismatched sublayers. For example, the sublayers can be formed of alternating layers of $Al_xGa_{1-x}N/Al_yGa_{1-y}N$ layers, where $0 \leq x, y \leq 1$ and a difference between the molar fractions of x and y is at least 0.1. In a more particular embodiment, the difference between x and y is greater than 0.5.

While both sacrificial layers 14A, 14B are described as being formed in a patterned surface of a substrate structure 12, it is understood that an embodiment of a sacrificial layer can include one or more patterned sub-layers. For example, fabrication of a sacrificial layer can include growth of a first sub-layer, patterning the first sub-layer, and growing a second sub-layer directly on the patterned first sub-layer. Growth of the second sub-layer can include one or more changes in composition to the second sub-layer as compared to the composition of the first sub-layer. Such changes can include one or more of: composition changes; V-III precursor ratio changes; growth temperature changes; and/or the like. However, it is understood that growth of both sub-layers can utilize the same growth conditions. While the growth of two sub-layers is described herein, it is understood that fabrication of a sacrificial layer can include growth of any number of sub-layers.

While each of the sacrificial layers 14A, 14B is shown including a particular number of regions, it is understood that a sacrificial layer 14A, 14B can include any number of regions. Similarly, while the first composition regions 24B are shown having a particular number of sublayers, it is understood that a first composition region 24B can include any number of sublayers. A total number of sublayers in the superlattice can be configured to induce stresses and strains within the sacrificial layer 14B that are high, but do not significantly alter the number of dislocations present in the layer(s) grown on the sacrificial layer 14B, if the sacrificial layer 14B was not included in the growth structure. In an embodiment, the dislocation density in the subsequently grown layer(s) should not increase by more than 10% due to the introduction of the sacrificial layer 14B. In another embodiment, the sacrificial layer 14B decreases the dislocation density when compared to semiconductor structures having no sacrificial layer 14B.

Figure 3:
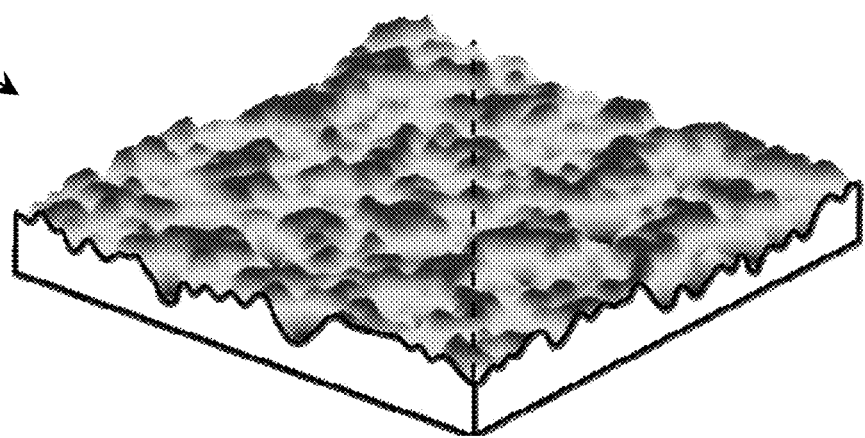
FIG. 3 shows schematics of illustrative compositional fluctuations of a sacrificial layer according to an embodiment.

An embodiment of a sacrificial layer described herein, such as the sacrificial layer 14 shown in FIG. 1A, can include a large number of lateral compositional fluctuations. Such fluctuations can be present across both dimensions of a lateral area of the sacrificial layer 14. For example, FIG. 3 shows schematics of illustrative compositional fluctuations of a sacrificial layer 14C according to an embodiment. For example, the sacrificial layer 14C can comprise an $Al_xIn_yGa_{1-x-y}N$ alloy with lateral fluctuations in aluminum and/or indium molar fractions.

The compositional fluctuations in the sacrificial layer 14C exceed normal fluctuations due to the limits of a growth process. A three dimensional growth method can be used for the sacrificial layer 14C to increase a magnitude of such fluctuations. An illustrative three dimensional growth process is described in U.S. Pat. No. 8,787,418, U.S. patent application Ser. No. 14/721,082, and U.S. Pat. No. 9,281,441, each of which is hereby incorporated by reference. To this extent, such fluctuations can be nano-scale and/or micron-scale compositional inhomogeneities. The fluctuations in composition can be several percent (e.g., three percent) or higher.

An embodiment of a sacrificial layer described herein, such as the sacrificial layer 14 shown in FIG. 1A, can include openings or vacancies and/or be disjoint. For example, a sacrificial layer described herein can include one or more regions comprising columnar structures. Examples of such a layer and the fabrication thereof are shown and described in U.S. patent application Ser. No. 14/504,456, U.S. patent application Ser. No. 14/519,230, and U.S. patent application Ser. No. 14/628,281, each of which is hereby incorporated by reference.

Figure 4A:
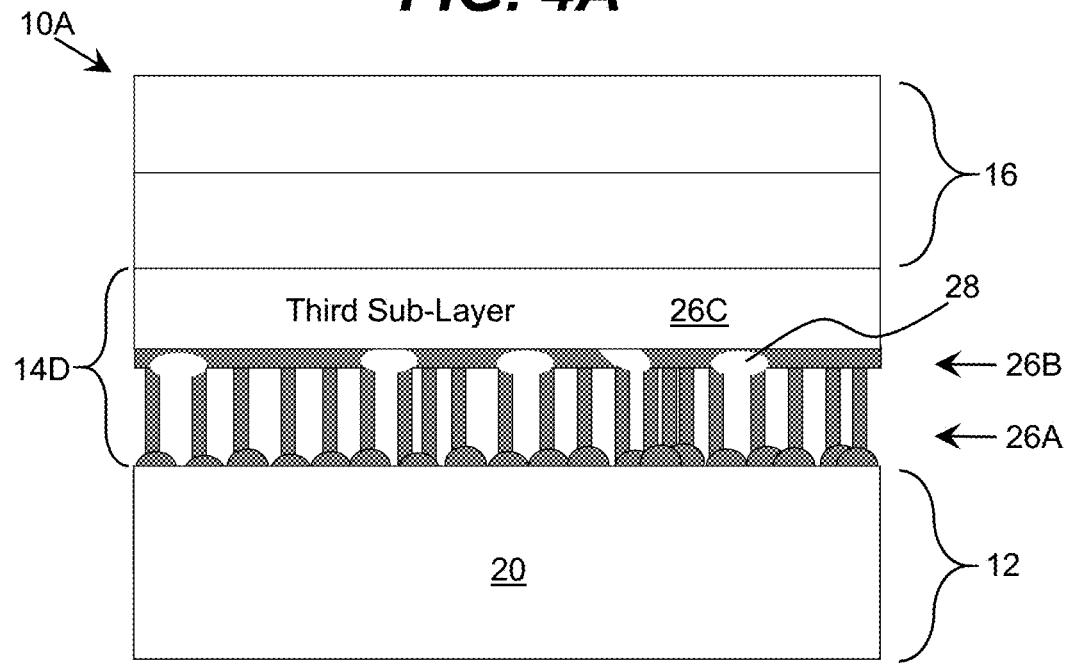
FIGS. 4A and 4B show illustrative growth heterostructures including composite sacrificial layers according to embodiments.
Figure 4B:
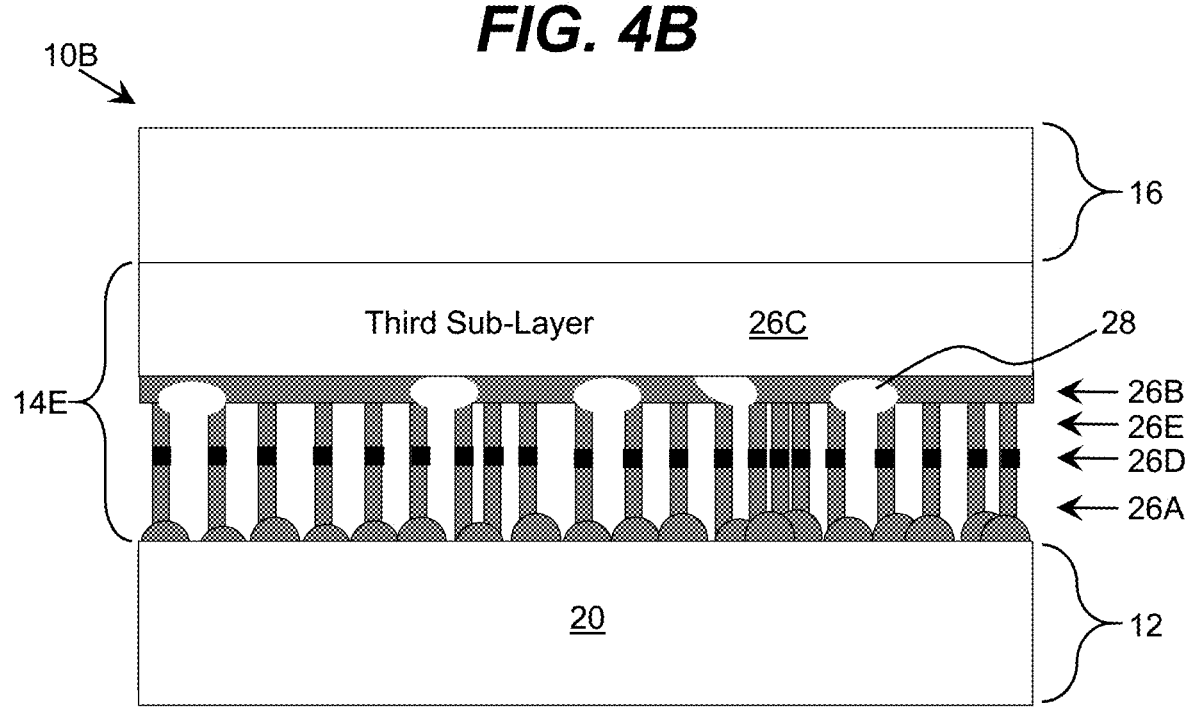

To this extent, FIGS. 4A and 4B show illustrative growth heterostructures 10A, 10B including composite sacrificial layers 14D, 14E, respectively, according to embodiments. In FIG. 4A, the composite sacrificial layer 14D can include multiple sub-layers 26A-26C. A first sub-layer 26A can include a plurality of columnar structures, and a second sub-layer 26B at least partially continuous (e.g., fill at least fifty percent of the lateral area of the sacrificial layer 14D). The second sub-layer 26B can physically connect at least some of the columnar structures of the first sub-layer 26A, but can include various cavities 28. The composite sacrificial layer 14D also can include a third sub-layer 26C which can be an essentially continuous semiconductor layer containing at most ten percent voids (i.e., at least ninety percent of the lateral area is covered by the essentially continuous sub-layer 26C). Inclusion of a columnar sub-layer 26A can make separation of the group III nitride heterostructure 16 from the substrate structure 20 easier. In an embodiment, the columnar sub-layer 26A is fabricated of a group III nitride semiconductor material that is absorbing to irradiated light used to induce decomposition of the sub-layer 26A due to ablation as described herein.

In FIG. 4B, the columnar structures include several sub-layers. For example, the sacrificial layer 14E includes a first sub-layer with columnar structures of a first material, followed by a second sub-layer 26D in which the material of the columnar structures is changed, and a third sub-layer 26E in which the material of the columnar structures is changed again. In one embodiment, the sub-layers 26A, 26E comprise the same materials, while the sub-layer 26D is a distinct material from the sub-layers 26A, 26E. For example, the material of the sub-layer 26D can be a superlattice layer, such as the superlattice layers 24B shown and described with reference to FIG. 2B.

Figure 5A:
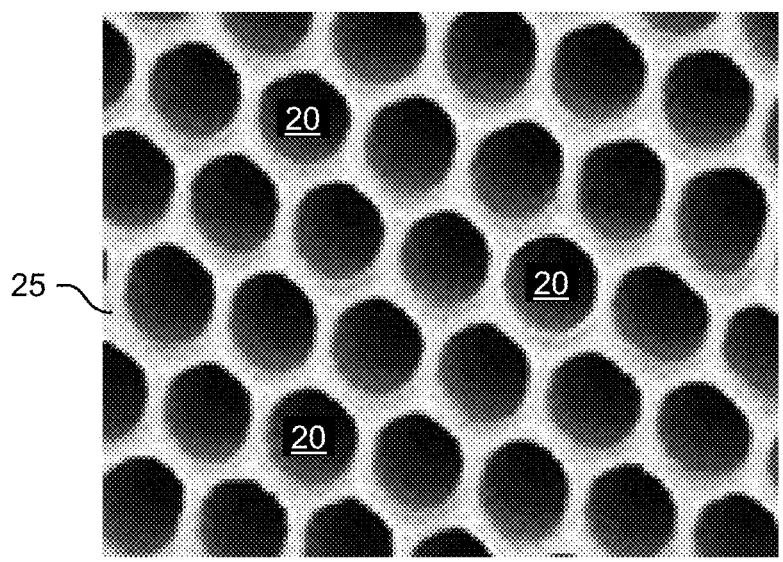
Figure 5B:
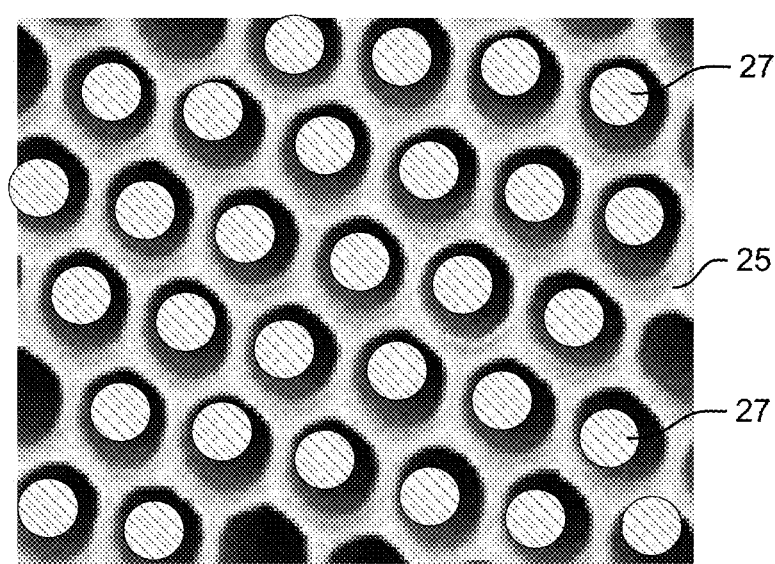

Furthermore, while not shown for clarity, it is understood that the sub-layer 26A can include a filler material surrounding the columnar structures, which includes openings within which the columnar structures are grown. An illustrative filler material comprises silicon dioxide. To this extent, FIGS. 5A and 5B show an illustrative process for growing columnar structures according to an embodiment. In FIG. 5A, a masking domain 25 can be formed on a top surface of a substrate structure 20. As illustrated, the masking domain 25 can include perforations, which extend completely through the masking domain 25 to the substrate structure 20. In FIG. 5B, columnar structures 27 are grown within the perforations of the masking domain 25. A thickness of the masking domain 25 can be selected to maintain pseudomorphic growth of the sacrificial layer relative to the underlying substrate structure 20.

Figure 5C:
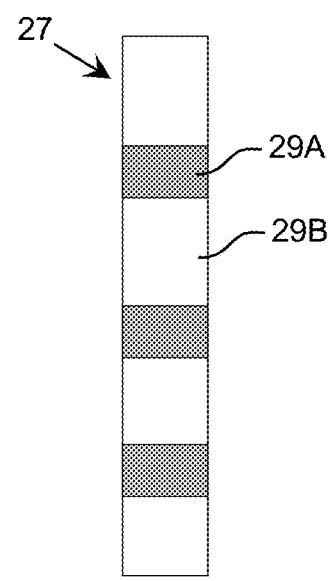
FIG. 5C shows an illustrative columnar structure including multiple sub-layers according to an embodiment.

As shown in FIG. 5B, a columnar structure 27 can include domains of different composition. To this extent, FIG. 5C shows an illustrative columnar structure 27 including multiple sub-layers 29A, 29B according to an embodiment. In an illustrative embodiment, the sub-layers 29A comprise AlInGaN with a high composition of gallium and some composition of indium, while the sub-layers 29B comprise AlInGaN with a higher composition of aluminum. For example, an aluminum molar fraction in sub-layer 29B can be greater than 0.6, while the sub-layer 29A can have an aluminum molar fraction less than 0.5.

Figure 6:
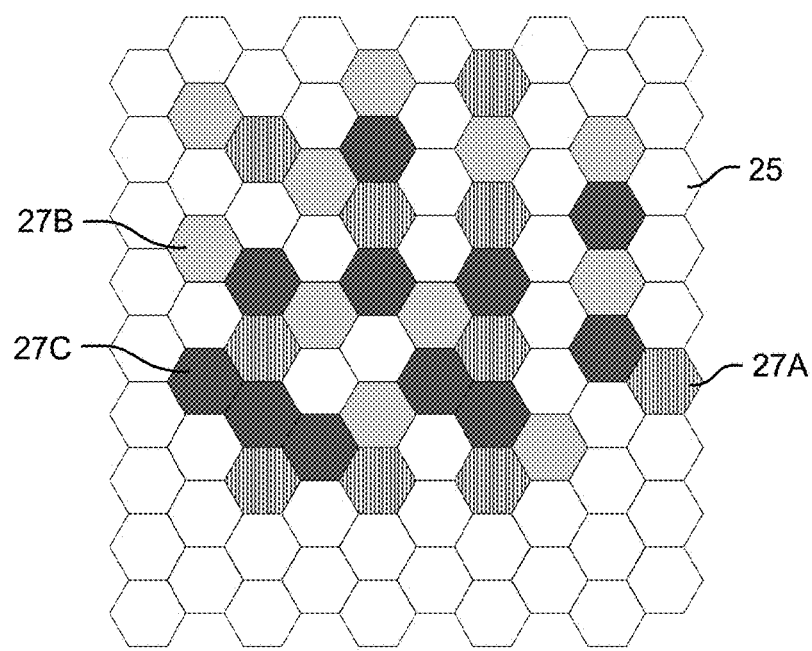
FIG. 6 shows a top view of laterally inhomogeneous columnar structures located within a masking material according to an embodiment.

A masking domain 25 can be patterned and etched multiple times to create a sacrificial layer including laterally inhomogeneous columnar structures. For example, FIG. 6 shows a top view of laterally inhomogeneous columnar structures located within a masking material 25, such as $SiO_2$, according to an embodiment. In this case, the columnar structures include columnar structures 27A-27C, each formed of a different material. For example, columnar structures 27A can be a material rich in aluminum, columnar structures 27B can be a dielectric material (e.g., a UV transparent dielectric material), and columnar structures 27C can be a gallium rich domains. Each type of columnar structure 27A-27C can be grown in turn after a corresponding patterning and etching of the making material 25. While a particular arrangement of the various materials 25, 27A-27C is illustrated, it is understood that any suitable arrangement, periodic or irregular, can be utilized.

Figure 7:
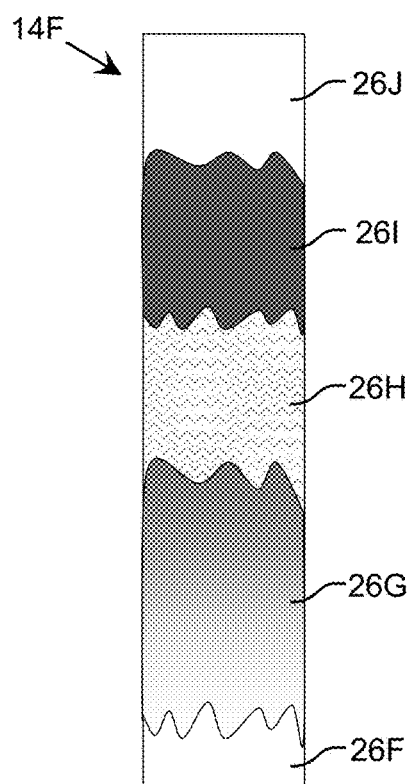
FIG. 7 shows an illustrative sacrificial layer including multiple sub-layers according to an embodiment.

It is understood that the sub-layers of a sacrificial layer and/or a columnar structure described herein can include any number of variations. For example, as illustrated in FIG. 7, a sacrificial layer 14F (or a columnar structure thereof) can include several sub-layers 26F-26J, which can be formed using various different materials, doping levels, growth parameters (e.g., temperature, time, V/III ratio), and/or the like. Additionally, one or more of the sub-layers, such as the sub-layer 26G, can have a graded composition and/or graded doping level. As illustrated by the irregular interfaces between the sub-layers 26F-26J, the growth process can promote variation in the surface boundary for one or more of the sub-layers.

As described herein, the substrate structure 12 can include one or more group III nitride layers. In an embodiment, a growth structure described herein can include a substrate structure 12 including a set of group III nitride layers configured to improve one or more features of a removal process described herein.

Figure 8A:
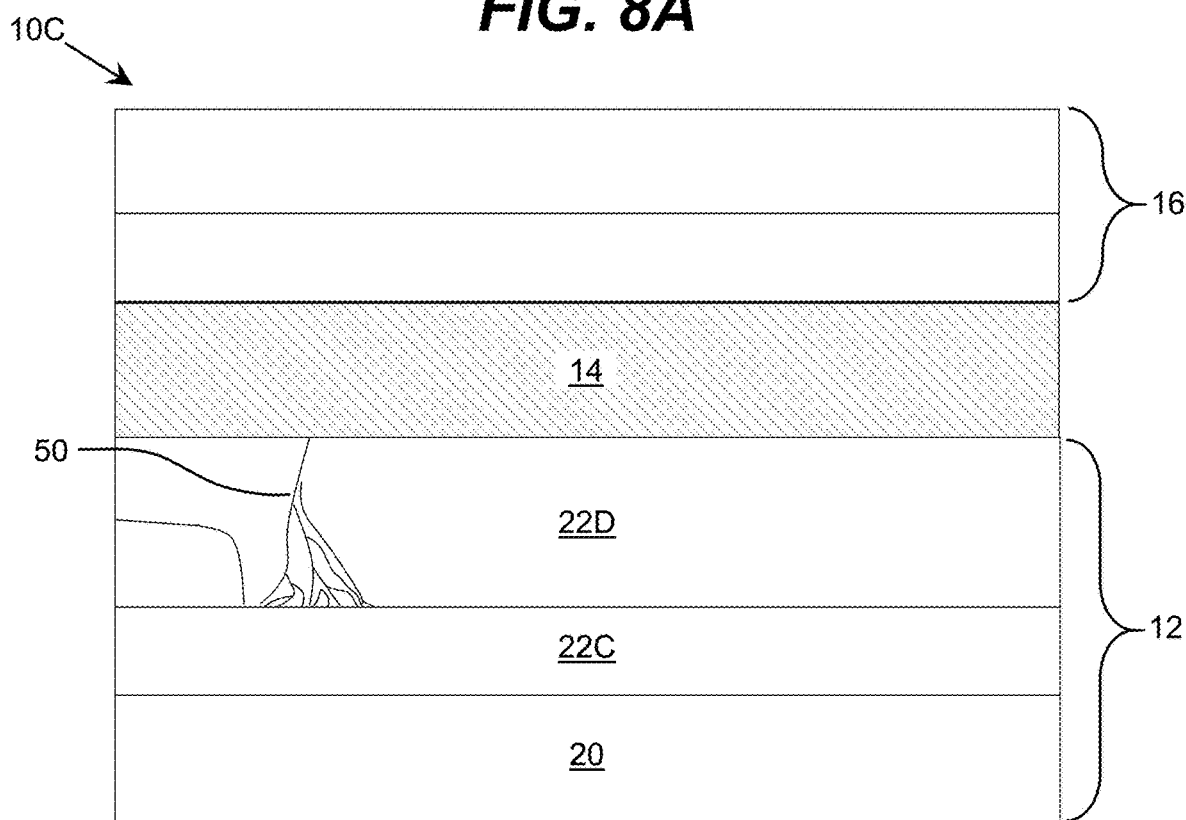
FIGS. 8A and 8B show an illustrative growth structure and top substrate structure layer according to an embodiment.

For example, FIG. 8A shows an illustrative growth structure 10C according to an embodiment. In this case, the growth structure 10C includes a substrate structure 12 including a substrate 20 on which a first layer 22C and a top substrate structure layer 22D are grown. The first layer 22C can comprise a buffer layer. The top substrate structure layer 22D can comprise a layer of group III nitride material having a reduced number of dislocations 50 at a top surface immediately adjacent to the sacrificial layer 14. In an embodiment, the top substrate structure layer 22D comprises a relatively thick (e.g., 1-20 μm) layer of aluminum nitride. In a more particular embodiment, the AlN top substrate structure layer 22D has a thickness in a range of 5-20 μm. Such an AlN top substrate structure layer 22D can allow reduction of dislocation densities, and also be reused for subsequent growth after removal of the group III nitride heterostructure 16. Growth of such a thick AlN layer 22D is currently the state of the art technology in epitaxial growth of group III nitride semiconductor films and can be accomplished by mitigating stresses within the film through introduction of compressive/tensile sub-layers where the sub-layers are grown by changing the V/III molar ratio used during growth.

Figure 8B:
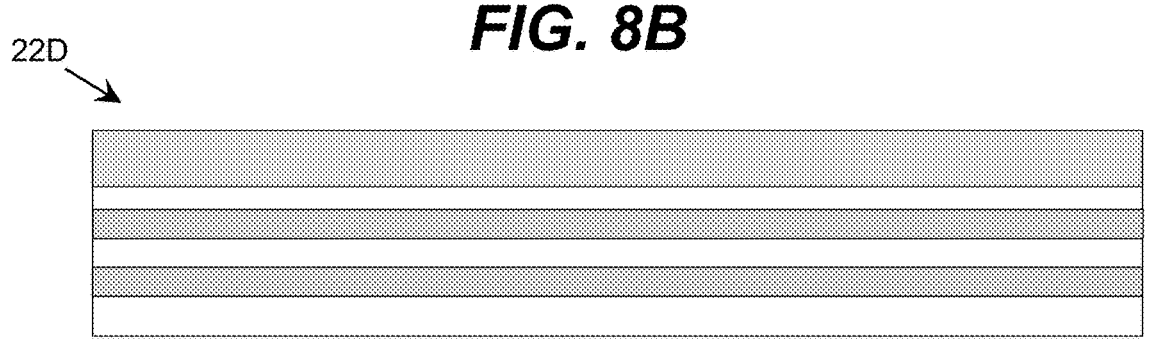

FIG. 8B shows an illustrative embodiment of the top substrate structure layer 22D, which includes several sub-layers forming a laminate structure. In an embodiment, the sub-layers can form a periodic pattern, in which case the top substrate structure layer 22D comprises a superlattice. A top substrate structure layer 22D including a compositional superlattice can further mitigate stresses. For example, the top substrate structure layer 22D can include lattices of the type: $Al_xGa_{1-x}N/AlN$, where x is between 0.7-0.9; or $Al_xGa_{1-y}N/Al_yGa_{1-y}N$, where x, y>0.7 and |x-y|<0.2.

Similarly, the sacrificial layer 14 can be sufficiently thick to allow for significant (e.g., at least 80%) or complete (at least 95%) absorption of radiation at the irradiated wavelength used in a removal process described herein. For example, the sacrificial layer 14 can comprise $Al_xGa_{1-x}N$, where the aluminum molar fraction and thickness are configured to prevent relaxation of the sacrificial layer 14, which can lead to a large number of dislocations, while also having a desired thickness. To further control the thickness, relaxation, and absorption properties, the sacrificial layer 14 also can comprise a laminate structure including multiple sub-layers of differing compositions. An embodiment of the sacrificial layer 14 can: comprise a superlattice having quantum wells and barriers; include one or more sub-layers with graded composition; include sub-layers that do not form a periodic pattern; and/or the like.

Figure 9:
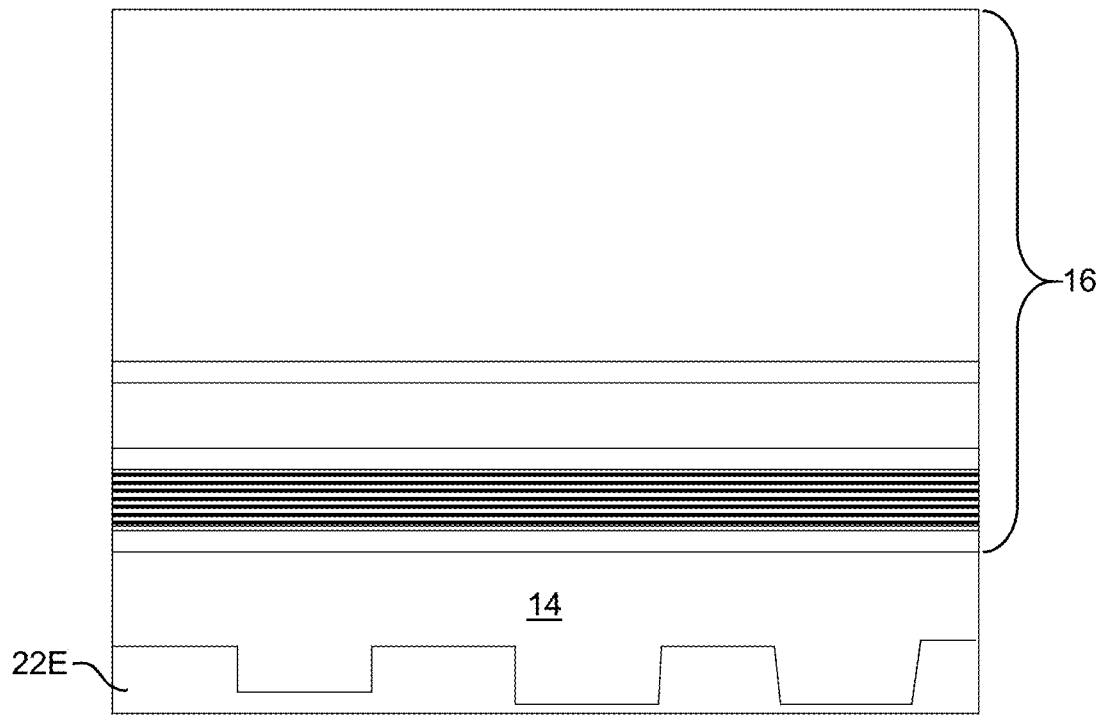
FIG. 9 shows a portion of a growth structure including a top substrate structure layer that is patterned.

As discussed herein, a surface of the substrate structure 12 can be configured to improve one or more attributes of the sacrificial layer 14 and/or the group III nitride heterostructure 16 grown thereon. To this extent, FIG. 9 shows a portion of a growth structure including a top substrate structure layer 22E that is patterned. For example, the patterning can include a periodic or irregular arrangement of openings and/or pillars, which extend partially into the top substrate structure layer 22E. Subsequently, a sacrificial layer 14 can be grown thereon, followed by growth of the group III nitride heterostructure 16. As illustrated, growth of the group III nitride heterostructure 16 can utilize various approaches for relieving stress and improving the quality of the semiconductor layers in the heterostructure 16. Such approaches can include, for example, growing alternating tensile/compressive layers, superlattices, and/or the like. In general, a first semiconductor layer in the heterostructure 16 adjacent to the sacrificial layer 14 is designed for stress control and can comprise a contact layer. For such a configuration, the first semiconductor layer can be p-type or n-type doped. Subsequently grown layers can be configured based on the corresponding device for which the heterostructure 16 is to be utilized.

Figure 10A:
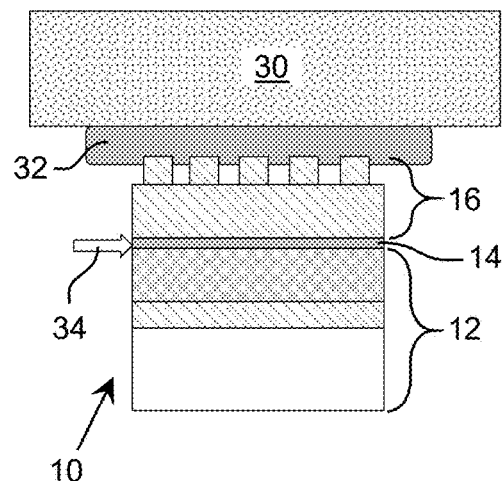
FIGS. 10A-10F show illustrative process steps for fabricating a device from a growth structure according to an embodiment.

As described herein, the sacrificial layer is included in a growth structure to enable the substrate structure 12 to be detached from the group III nitride heterostructure 16. The heterostructure 16 can be further processed to fabricate a device package including the heterostructure 16. To this extent, FIGS. 10A-10F show illustrative process steps for fabricating a device from a growth structure according to an embodiment. As shown in FIG. 10A, after fabricating a growth structure 10 a handling member, such as a carrier substrate 30, can be attached to the heterostructure 16 using any solution. For example, the carrier substrate 30 can be bonded to the group III nitride heterostructure 16 using any suitable bonding material 32, such as an epoxy, soldering, and/or the like. The carrier substrate 30 can comprise, for example, sapphire, glass, and/or the like.

Subsequently, the sacrificial layer 14 is decomposed to release the substrate structure 12 from the group III nitride heterostructure 16. In an embodiment, decomposing the sacrificial layer 14 includes irradiating a side surface of the sacrificial layer 14 with a laser 34. The laser 34 can be used to completely separate the substrate structure 12 and the group III nitride heterostructure 16 to result in the structure shown in FIG. 10B.

Figure 10D:
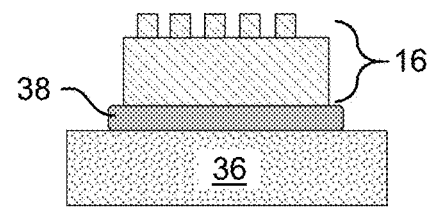
Figure 10B:
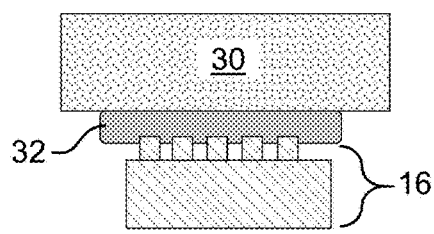
Figure 10E:
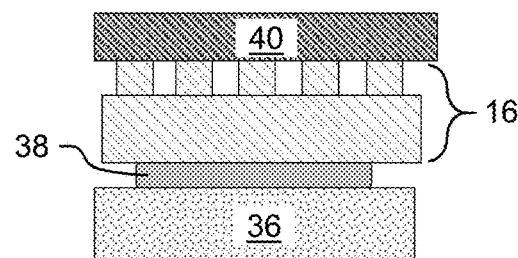
Figure 10C:
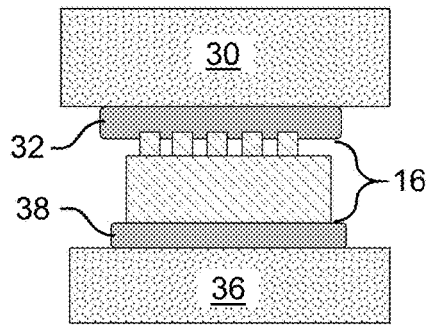
Figure 10F:
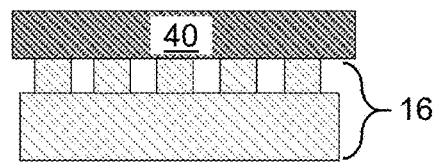

Further processing can be performed to attach the group III nitride heterostructure 16 to a submount and/or package for the device. In FIG. 10C, a new carrier substrate 36 (e.g., sapphire or glass) can be attached to a bottom portion of the group III nitride heterostructure 36 using any suitable bonding material 38 (e.g., epoxy or solder). In FIG. 10D, the carrier substrate 30 is removed using any solution (e.g., dissolving the epoxy using a chemical or reflowing the solder). In FIG. 10E, the submount 40 can be attached to the group III nitride heterostructure 16 using any solution. For example, the submount 40 can be attached to one or more layers of the heterostructure 16 using a set of electrodes. In FIG. 10F, the carrier substrate 36 is removed using any solution (e.g., chemical or reflow). As a result, upon completion of the process, a device including the group III nitride heterostructure 16 is provided. Depending on the device and targeted use of the device, it is understood that the sequence of the steps can be altered and some steps can be removed or changed. For example, it is feasible to attach submount 40 and the submount carrying structure as a first step in FIG. 10A. In general, it is understood that while the attachment of the substrate 30 can be performed using epoxy, attachment of the submount 40 can be performed using soldering and result in a very different permanent connection with the heterostructure 16.

Figure 11A:
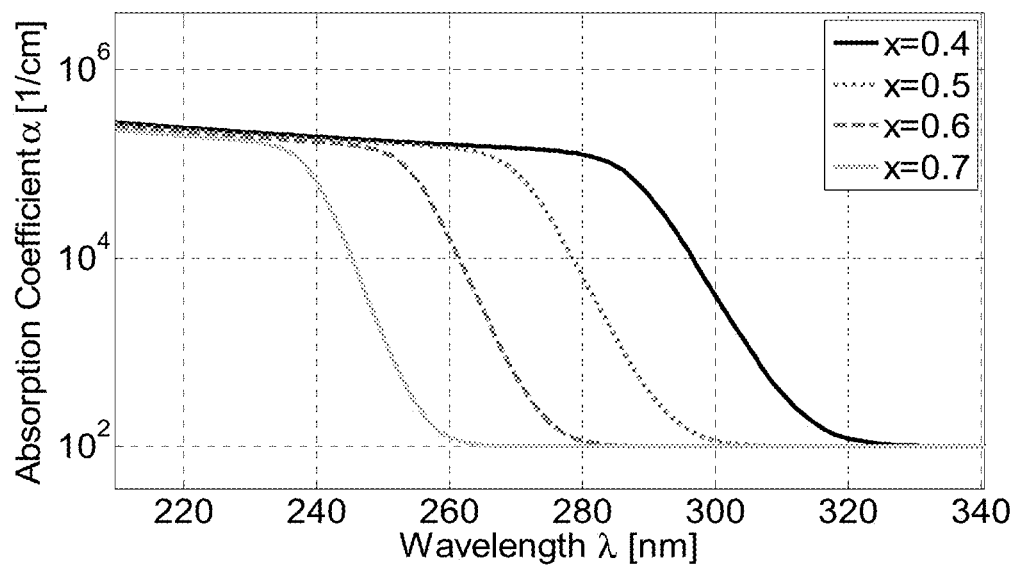
FIGS. 11A and 11B illustrate the relationship between the wavelength, absorption coefficient, and aluminum content of an AlGaN material.
Figure 11B:
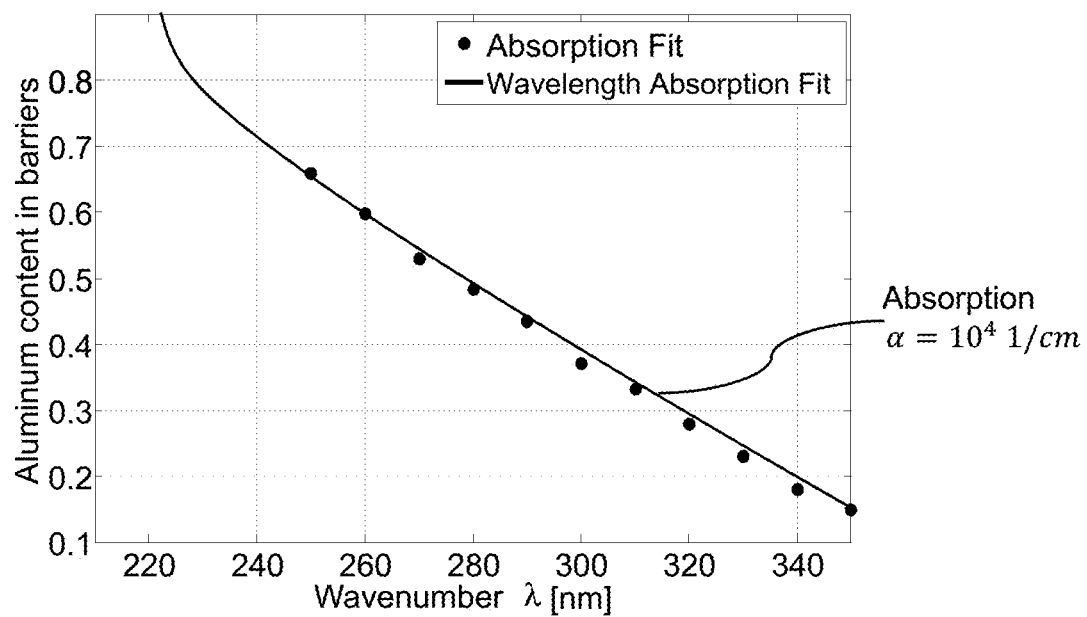

A wavelength of the radiation utilized to release the substrate structure 12 from the group III nitride heterostructure 16 can be selected to provide high absorption in the sacrificial layer 14 without substantial absorption in the layers in the substrate structure 12. As described herein, the sacrificial layer 14 can comprise an AlGaN semiconductor layer. To this extent, FIGS. 11A and 11B illustrate the relationship between the wavelength, absorption coefficient, and aluminum content (x) of an AlGaN material. In particular, FIG. 11A shows the absorption coefficient as a function of wavelength for various illustrative aluminum molar fractions (x) for AlGaN, while FIG. 11B shows the absorption fit for several aluminum molar fraction and wavelength pairs. As illustrated in FIG. 11A, each aluminum molar fraction has a corresponding absorption edge at which point the absorption coefficient drops significantly. However, for all aluminum molar fractions, absorption above the absorption edge is on the order of $\alpha=10^5$ 1/cm, and more conservatively, $\alpha=10^4$ 1/cm as shown in FIG. 11B, resulting in a loss of intensity $I=I_0\exp(-\alpha x)$, which provides complete absorption over a thickness of several hundred nanometers. To this extent, an embodiment of the sacrificial layer 14 can comprise GaN or $Al_{0.2}Ga_{0.8}N$, with a radiation wavelength chosen to be about 260 nm which can be obtained, for example, by doubling of 532 nm radiation from a frequency-doubled Nd:YVO4 laser. It is understood that FIG. 11B is an approximation, and is not exactly linear. For example, at lower wavelengths, the absorption exhibits a somewhat non-linear behavior.

A power of the laser radiation can be calculated by: $I=Cp H\Delta T$, where C is the specific heat (energy required to raise the one gram of the substance by one degree), p is the density of the film (such as the sacrificial layer 14), H is the thickness of the film, I is the laser intensity, and $\Delta T$ is the required change of temperature for disintegrating the material. These values are available in the literature for the AlGaN semiconductor devices, and the laser intensity can be easily estimated. For example, the laser intensity for GaN/Sapphire lift-off can be approximately 750 mJ/cm$^2$.

A thickness (H) of the sacrificial layer 14 can be selected to be larger than a characteristic absorption length corresponding to a length within the corresponding material where the intensity of the radiation diminishes by ⅔ of its original intensity. In an embodiment, the thickness of the sacrificial layer 14 can be between 50 nm and 1 µm.

It is understood that the use of a laser 34 to separate the substrate structure 12 from the group III nitride heterostructure 16 can be combined with one or more other approaches for separating the structures 12, 16. To this extent, removal of the substrate structure 12 can further include chemical removal, such as etching the sacrificial layer 14. For example, the sacrificial layer 14 can be at least partially etched using hydrofluoric acid or the like. In this case, at least the substrate structure 12 and the sacrificial layer 14 can be placed in a bath of hydrofluoric acid or the like. Additionally, the separation can use chemical/photochemical etching in a solution with surfactants for improved wetting of the narrow space between the sapphire and nitride (for example a tetramethylammonium hydroxide (TMAH) solution with surfactants). In an embodiment, the removal process includes laser decomposition and chemical etching to completely separate the structures 12, 16.

Figure 12A:
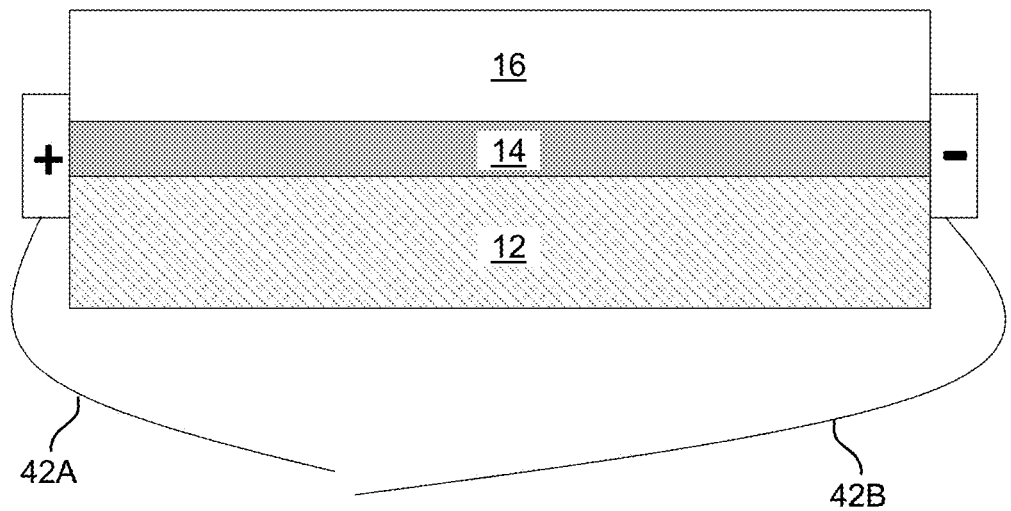
FIGS. 12A and 12B show illustrative schematics for using electrical current for separating a substrate structure from a group III nitride heterostructure according to embodiments.
Figure 12B:
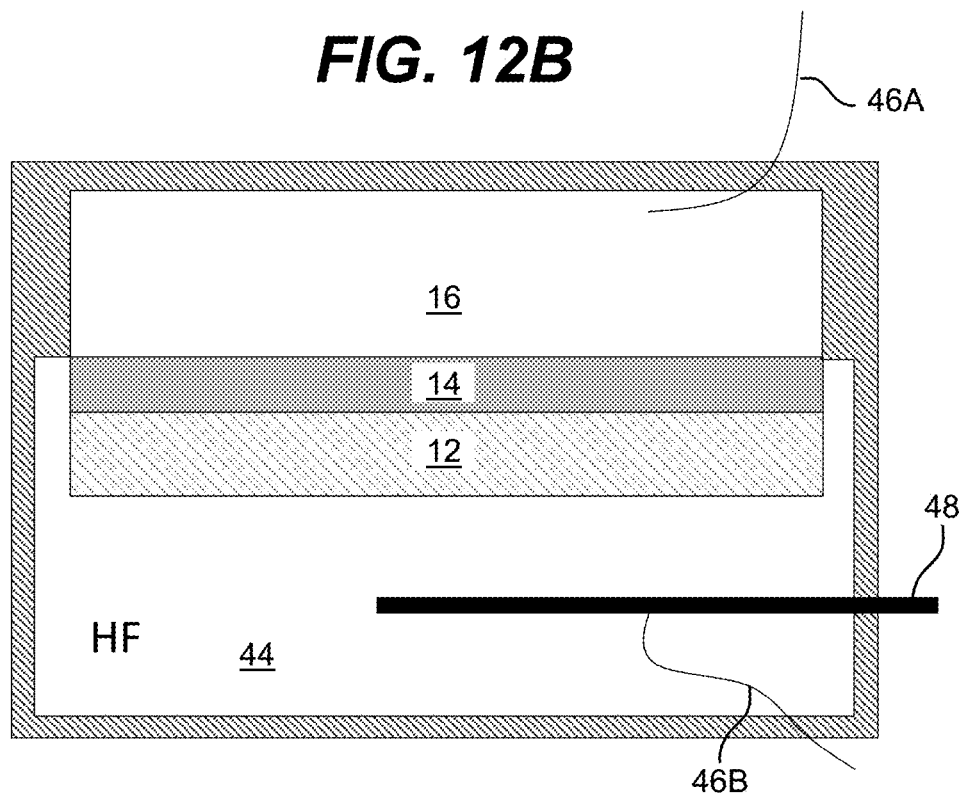

In another embodiment, separation of the structures 12, 16 includes passing an electrical current through the sacrificial layer 14. To this extent, FIGS. 12A and 12B show illustrative schematics for using electrical current for separating a substrate structure from a group III nitride heterostructure according to embodiments. In FIG. 12A, a current can be administered through the sacrificial layer 14 via a pair of electrodes 42A, 42B connected to opposing sides of the sacrificial layer 14 and a current source (not shown for clarity). In this case, the sacrificial layer 14 can be heavily doped and the electrical current can induce ablation through joule heating.

It is understood that a removal process can include any combination of laser decomposition, chemical etching, and/or joule heating. For example, FIG. 12B shows an illustrative schematic for separating a substrate structure 12 from a group III nitride heterostructure 16 using electrical current and chemical etching according to embodiment. In this case, the substrate structure 12 and the sacrificial layer 14 are placed into a chamber 44 comprising, for example, hydrofluoric (HF) acid or another suitable acid. A pair of electrodes 46A, 46B are attached and current is passed there through to facilitate electro-chemical lift-off. An electrode 48 can comprise a material resistant to the effects of the acid within the chamber 44, such as platinum. Such etching can be particularly useful when the sacrificial layer 14 includes a masking material, such as silicon dioxide, and columnar structures as described herein.

Figure 13A:
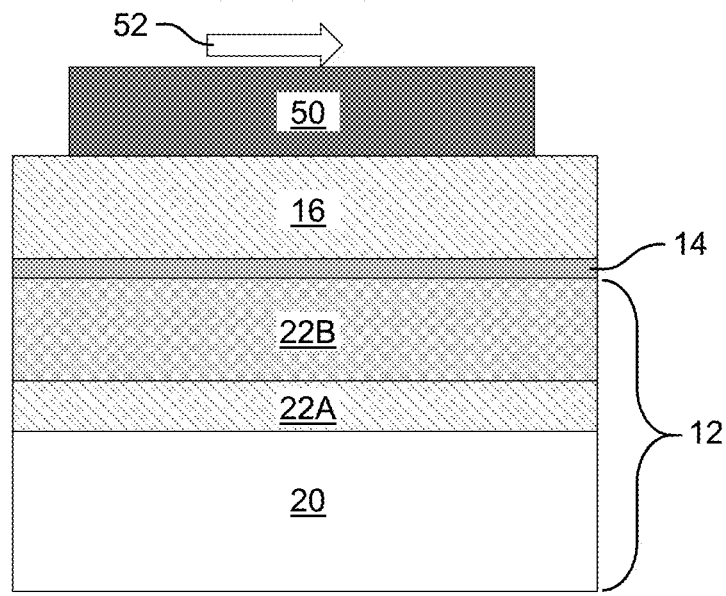
FIGS. 13A and 13B show an illustrative removal processes including laser decomposition combined with a mechanical force according to embodiments.
Figure 13B:
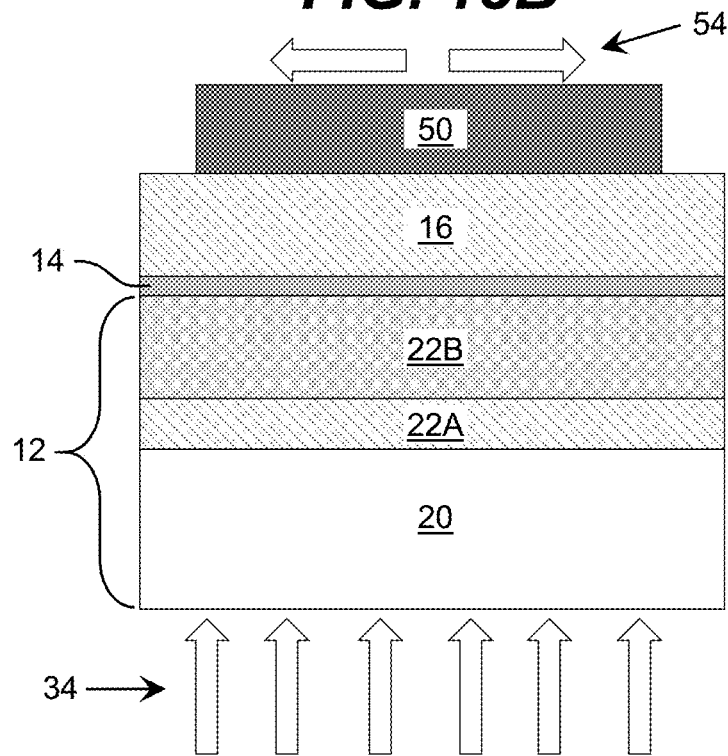

Furthermore, a removal process can include one or more of laser decomposition, chemical etching, and/or joule heating combined with a mechanical force. To this extent, FIGS. 13A-13B show illustrative removal processes including laser decomposition combined with a mechanical force according to embodiments. As illustrated, a laser 34 can be directed toward the sacrificial layer 14 through the substrate structure 12. In this case, the substrate structure 12 can include a substrate 20 and a set of semiconductor layers 22A-22B which do not absorb a significant portion of the laser 34 before the laser reaches the sacrificial layer 14. The sacrificial layer 14 can comprise a material and a thickness that absorbs substantially all of the laser 34 before it reaches the group III nitride heterostructure 16.

Regardless, the group III nitride heterostructure 16 can be physically attached (e.g., via a carrier substrate 30 shown in FIG. 10B) to a mechanical actuator 50, which generates a mechanical force while the laser 34 is directed toward the sacrificial layer 14. As illustrated in FIG. 13A, the mechanical force 52 can be a steady shear force exerted on the heterostructure 16. As illustrated in FIG. 13B, the mechanical force 54 can be a vibrational force exerted on the heterostructure 16. A combination of the laser 34 and mechanical force 52, 54 can result in lift-off of the heterostructure 16 from the substrate structure 12. In an embodiment, the laser 34 can be operated in a pulsed mode. In this case, the mechanical force 52, 54 can prevent recrystallization of chemical bonds in the sacrificial layer 14 and improve the lift-off. It is understood that the mechanical force 52, 54 can be initiated after an initial period of operating the laser 34 to allow some degradation of the sacrificial layer 14 to occur first.

While primarily shown and described in conjunction with detaching the group III nitride heterostructure 16 from the substrate structure 12, it is understood that embodiments can be directed to only the partial detachment of the heterostructure 16 from the substrate structure 12. For example, such partial detachment can be utilized to relieve stress, provide optical scattering, and/or the like.

Figure 14A:
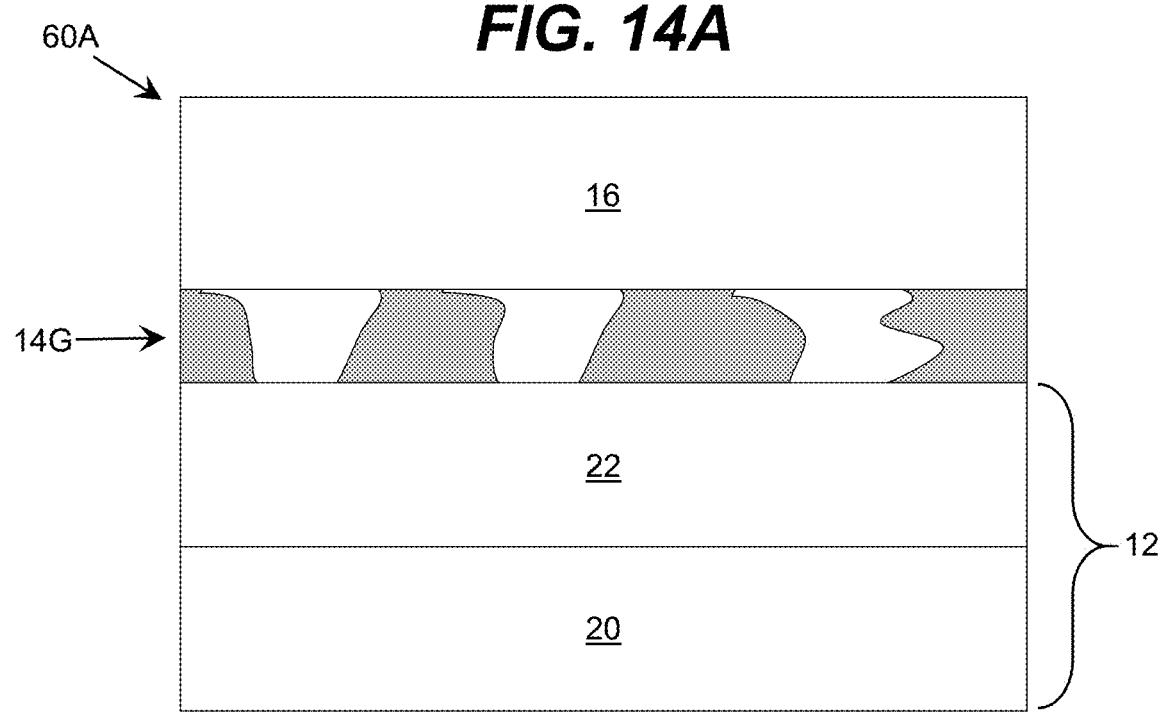
FIGS. 14A and 14B show illustrative device structures after partial ablation of the sacrificial layer according to embodiments.
Figure 14B:
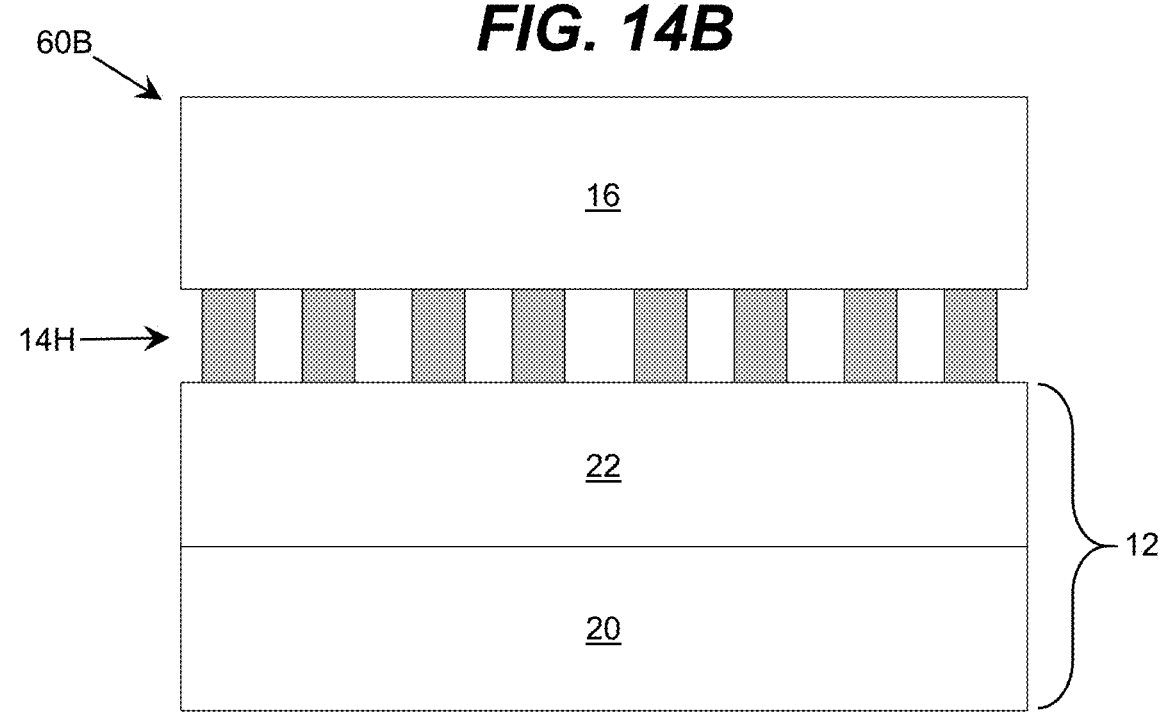

To this extent, FIGS. 14A and 14B show illustrative device structures 60A, 60B after partial ablation of the sacrificial layer 14G, 14H, respectively, according to embodiments. In this case, each device structure 60A, 60B includes an active group III nitride heterostructure 16 attached to a substrate structure 12 by a sacrificial layer 14G, 14H that has been partially destroyed, e.g., by laser ablation, chemical etching, mechanical forces, electrical current, and/or the like. Partial laser ablation can be accomplished by laterally changing an intensity of the laser radiation utilized, which can result in a sacrificial layer 14G having a random ablation pattern or a sacrificial layer 14H having a periodic ablation pattern. For the manufacturing of a device 60A, 60B configured to emit radiation, the ablation pattern for a sacrificial layer 14G, 14H can be configured to comprise a photonic crystal, form a distributed Bragg reflector, form a diffraction grating, and/or form any other similar type of distributed element for manipulating the properties of the radiation. In an alternative embodiment, the structures 60A, 60B can be intermediate structures and complete lift-off of the heterostructure 16 can be accomplished by subsequent mechanical forces (e.g., physical peeling), chemical etching, and/or the like.

Figure 15A:
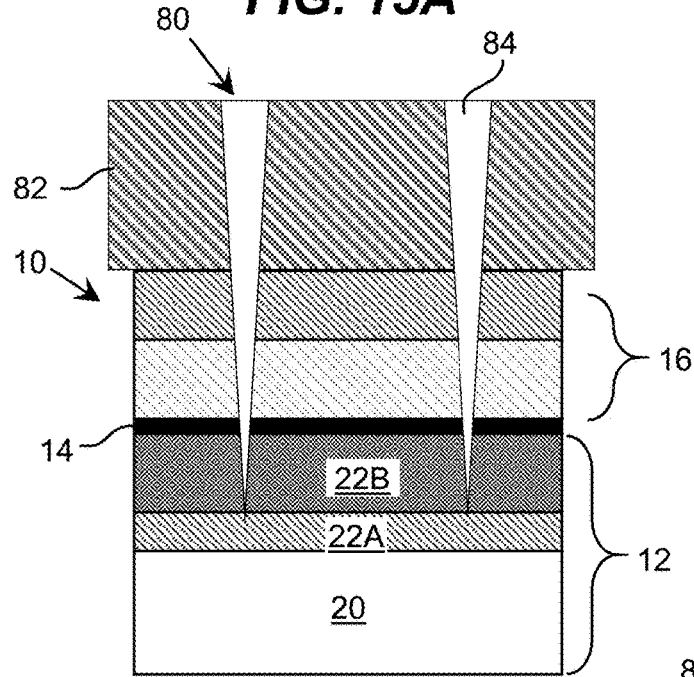
FIGS. 15A and 15B show side and top views of an illustrative growth structure according to an embodiment.
Figure 15B:
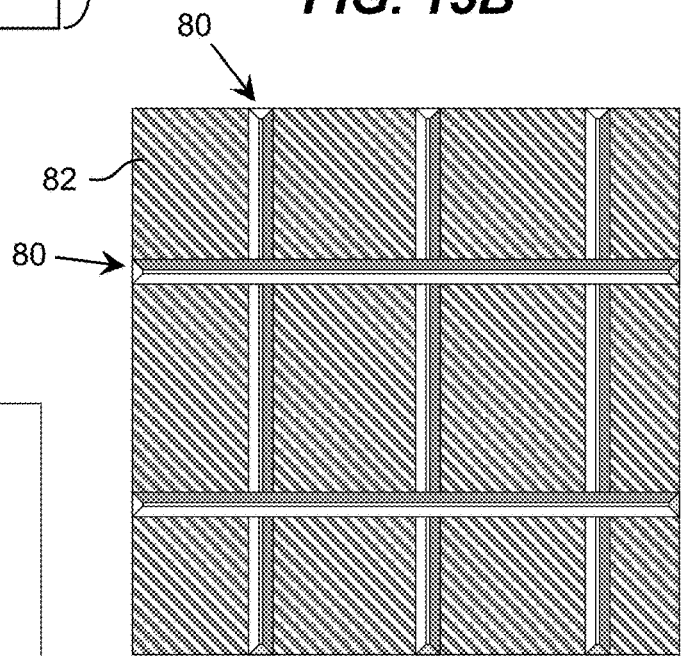

In an embodiment, grooves can be formed in the growth structure 10 prior to lift-off of the heterostructure 16. To this extent, FIGS. 15A and 15B show side and top views of an illustrative growth structure 10 according to an embodiment. In an embodiment, the grooves 80 penetrate the growth structure 10 to an extent at least below the sacrificial layer 14. For example, the grooves are shown extending beyond the layer 22B and partially into the layer 22A. However, it is understood that this is only illustrative, and the grooves 80 can penetrate to any location at least as deep as the sacrificial layer 14. To this extent, in other embodiments some or all of the grooves can terminate within any of the substrate 20, within any layer 22A, 22B located below the sacrificial layer 14, or within the sacrificial layer 14.

Prior to formation of the grooves 80, a masking layer 82 can be formed on the group III nitride heterostructure 16, e.g., to protect the group III nitride heterostructure 16 during formation of the grooves 80. The grooves 80 can be fabricated using any combination of one or more solutions, including photolithography, etching, laser scribing, and/or the like. The masking layer 82 can be formed of any material suitable for protecting the group III nitride heterostructure 16 during formation of the grooves 80. Illustrative materials include photoresists, such as diazonaphthoquinone. In an embodiment, the grooves 80 are filled with a dielectric material 84, which can reduce oxidation of the semiconductor layers and/or manage the light extraction efficiency. The dielectric material 84 can be selected such that it is transparent to the radiation that will be emitted or sensed by the resulting optoelectronic devices. Illustrative dielectric materials 84 include $SiO_2$, $Al_2O_3$, $Si_3N_4$, $CaF_2$, $MgF_2$, $HfO_2$, epoxy, and/or the like.

The grooves can have any convenient placement forming regions between the grooves, each of which can correspond to a heterostructure used for forming one or more optoelectronic devices, such as one or more light emitting diodes. As illustrated in FIG. 15B, the grooves 80 can run laterally through the heterostructure, with both parallel and intersecting grooves 80, thereby forming a mesh defining multiple distinct regions. In an embodiment, immediately adjacent parallel grooves 80 are separated by a distance that corresponds to a size of at least one optoelectronic device. An illustrative size range for an optoelectronic device is between 0.1 millimeters and 10 millimeters. While the intersecting grooves 80 are shown having substantially perpendicular orientations and each groove 80 is shown as a straight line, it is understood that these features are only illustrative and groove 80 of various orientations and including one or more curves can be formed in the growth structure 10.

Figure 16:
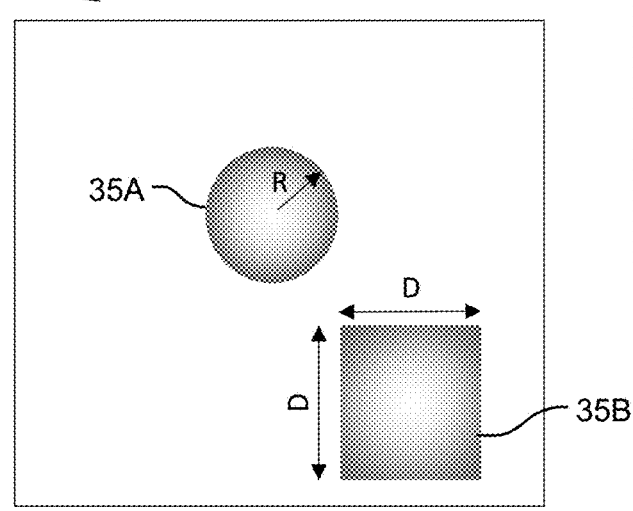
FIG. 16 shows impact areas for two illustrative laser beams according to embodiments.

In an embodiment, size of a laser beam is selected to be substantially smaller in area than the lateral area of the group III nitride heterostructure. Use of a laser beam of this size can enable optimization of the lift-off process for the heterostructure 16, e.g., for semiconductor layers including aluminum nitride. FIG. 16 shows impact areas for two illustrative laser beams 35A, 35B according to embodiments. As illustrated, a laser beam 35A can have an elliptical (e.g., circular) shape, while a laser beam 35B can have a rectangular (e.g., square) shape. However, it is understood that these shapes are only illustrative and a laser beam can have any shape. Regardless, in an embodiment, the laser beam 35A, 35B has a cross-sectional area that is at least twice as small as a cross-sectional area of the growth structure 10. In a more particular embodiment, the laser beam 35A, 35B has a cross-sectional area that is at least twice as small as a cross-sectional area of each optoelectronic device to be fabricated using the growth structure 10 (e.g., a cross-sectional area of each region defined by the grooves shown in FIGS. 15A and 15B). In an embodiment, such a cross-sectional area is less than 1 millimeter.

Regardless, the laser lift-off can be accomplished by moving the laser beam laterally over the area of the growth structure 10 to decompose the sacrificial layer located therein. Such movement can include at least some overlap of the lateral regions irradiated by the laser beam. The laser wavelength can be selected to be absorbed by the sacrificial layer. In an embodiment, the laser wavelength can range from 190-260 nm. In a more particular embodiment, the peak laser wavelength can be 248 nm. Such wavelengths may not be significantly absorbed by a buffer layer (e.g., formed of aluminum nitride), but will be absorbed by a sacrificial layer having a smaller bandgap than the buffer layer. In an embodiment, the laser wavelength and composition of the sacrificial layer are selected to result in an absorption coefficient of at least $10^4$ inverse centimeters.

A sacrificial layer described herein can have a uniform composition or a varying composition. For example, the sacrificial layer can have a uniform composition averaged over a square area of 100 nanometer sides with compositional variation not exceeding 10%. The sacrificial layer can comprise a layer that has composition gradient in a growth direction, where the sacrificial layer can comprise $Al_xGa_{1-x}N$ layer or layer that can also incorporate indium and/or boron. Additionally, a sacrificial layer described herein can comprise a laminate layer having sub-layers of distinctly different compositions. In an embodiment, a laminate can have sublayers having higher composition of GaN, resulting in a lower bandgap and a higher absorption of the laser radiation. Still further, the sacrificial layer 14 can be undoped or have n-type (e.g., silicon dopants) or p-type (e.g. magnesium dopants) doping. Doping the sacrificial layer can introduce additional point defects within the layer, resulting in a lower homogeneity, and as a result, improved decomposition properties.

Figure 17:
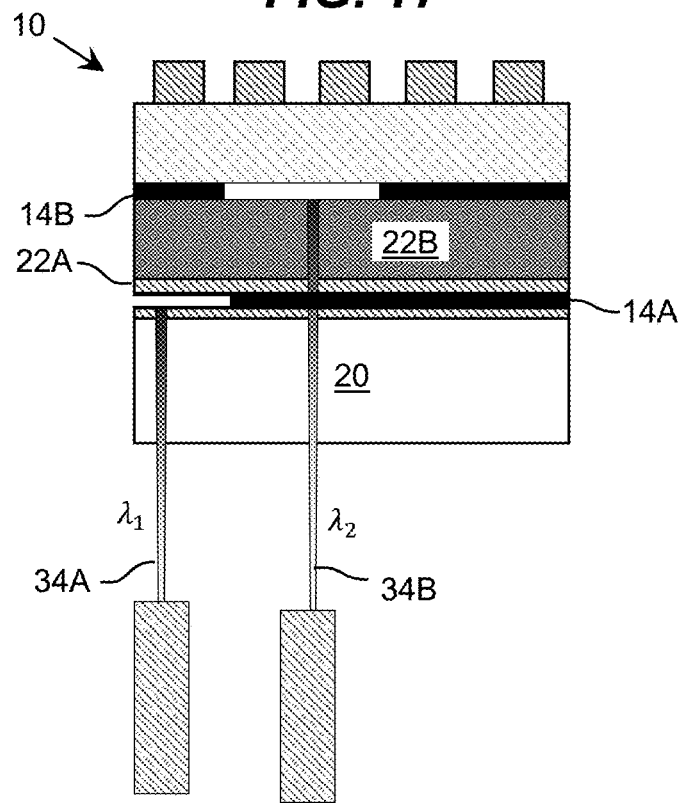
FIG. 17 shows an illustrative growth structure, which includes two sacrificial layers according to an embodiment.

In an embodiment, a growth structure 10 described herein can include multiple, non-adjacent sacrificial layers. For example, FIG. 17 shows an illustrative growth structure 10, which includes two sacrificial layers 14A, 14B according to an embodiment. In an embodiment, each sacrificial layer 14A, 14B has a different composition. In this case, as well as when a sacrificial layer comprises a laminate of sub-layers of different compositions, the respective compositions can be effectively decomposed with laser beams 34A, 34B of distinct wavelengths $\lambda_1$, $\lambda_2$, respectively. To this extent, a first laser beam 34A with a first wavelength $\lambda_1$ is used to decompose the first sacrificial layer 14A (e.g., the layer 22A), whereas a second laser beam 34B with a wavelength $\lambda_2$ different from the first wavelength $\lambda_1$ is used to decompose the second sacrificial layer 14B. As illustrated, each laser beam 34A, 34B can have a small lateral area and can be moved laterally to decompose the corresponding layer 14A, 14B. In an embodiment, the decompositions can be performed in a staggered manner, with vertically overlapping or non-overlapping areas of the sacrificial layers 14A, 14B being decomposed. Such a configuration can enable lift-off at several different locations, resulting in corrugated outside surface that can be used to improve light extraction efficiency.

As shown in various embodiments, the lift-off can direct the laser through a substrate 20 and one or more group III nitride layers 22A, 22B prior to the laser impeding the sacrificial layer 14. To this extent, the substrate 20 and/or group III nitride layer(s) 22A, 22B can be selected to be transparent to the laser. In an embodiment, the substrate 20 is formed of sapphire. To further reduce absorption of the laser by the substrate 20, the substrate 20 can be thinned after fabrication of the growth structure 10, but prior to performing the lift-off. Additionally, prior to thinning the substrate 20, the semiconductor layers can be bonded from the top to a conductive holder in order to conduct mechanical processing of the sapphire/semiconductor film assembly.

Figure 18:
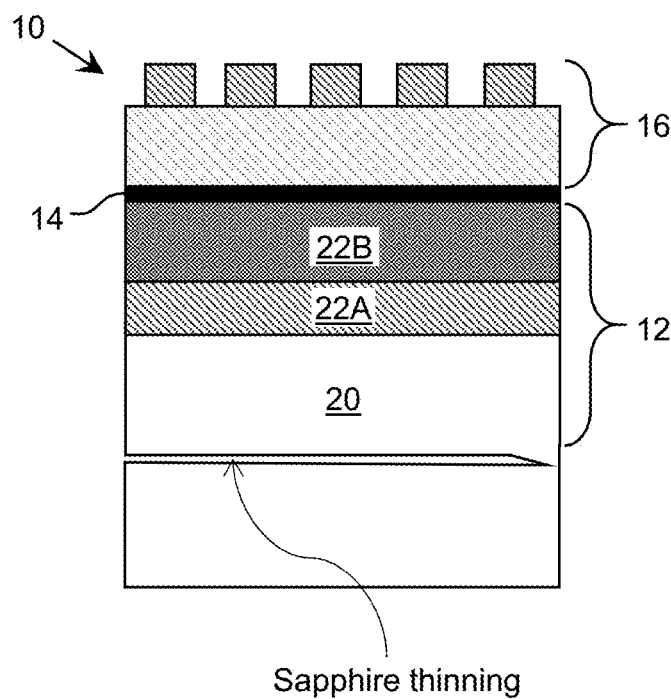
FIG. 18 shows an illustrative embodiment in which the substrate is thinned prior to lift-off according to an embodiment.

Regardless, FIG. 18 shows an illustrative embodiment in which the substrate 20 is thinned prior to the lift-off according to an embodiment. In particular, the substrate 20 is shown being laterally cut to remove a portion thereof. The substrate 20 can be thinned using any solution, such as polishing. In an embodiment, the remaining substrate 20 has a thickness on the order of 100 microns or no more than 200 microns in another embodiment. By thinning the substrate 20, an amount of scattering and absorption that occurs during the laser lift-off can be reduced. Additionally, mechanical stresses presented in the growth structure 10 also can be reduced prior to performing the lift-off process.

After thinning the substrate 20 and/or when no thinning is desired, the substrate 20 can be further processed to reduce scattering of the laser. For example, the back surface of the substrate 20 can be polished to have a root mean square (RMS) roughness that is less than the smallest wavelength of the laser(s) used to perform the lift-off. In an embodiment, the RMS roughness is less than fifty nanometers. In an embodiment, an anti-reflective coating can be applied to the back surface of the substrate 20 to reduce reflection at the interface between the substrate 20 and ambient.

Figure 19:
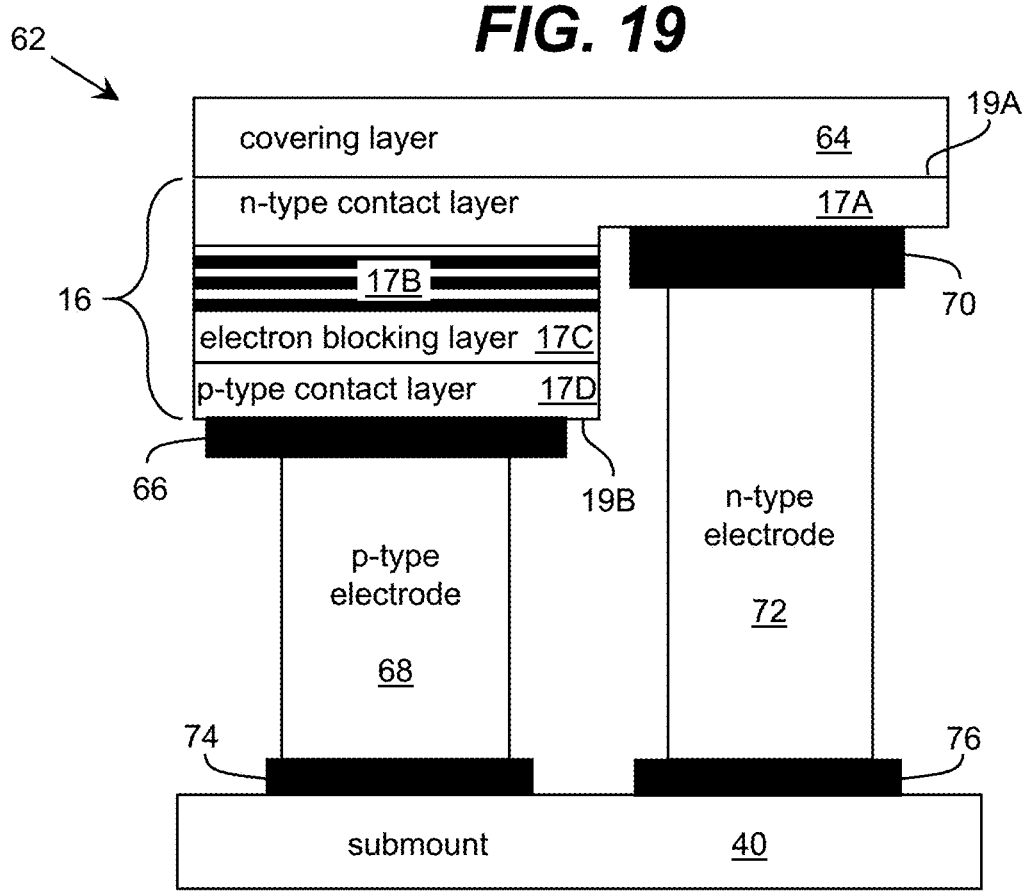
FIG. 19 shows a schematic structure of an illustrative optoelectronic device fabricated from a group III nitride heterostructure according to an embodiment.

In addition to removal of the substrate structure 12, the group III nitride heterostructure 16 can undergo further processing to result in a completed device. FIG. 19 shows a schematic structure of an illustrative optoelectronic device 62 fabricated from a group III nitride heterostructure 16 according to an embodiment. In this case, the device 62 is fabricated from a heterostructure 16, which includes an n-type contact layer 17A, an active region 17B (e.g., a series of alternating quantum wells and barriers), an electron blocking layer 17C, and a p-type contact layer 17D. However, it is understood that this heterostructure 16 is only illustrative and various alternative heterostructures 16 can be utilized.

As illustrated, the device 62 is configured to operate in a flip-chip configuration. In this case, the n-type contact layer 17A is located on a top side of the optoelectronic device 62 and can be configured to be transparent to radiation generated by the active region 17B. To this extent, after removal of a substrate structure described herein, e.g., via ablation of a sacrificial layer on which the n-type contact layer 17A can be grown directly thereon, a covering layer 64 can be formed on the n-type contact layer 17A. The covering layer 64 can include one or more features to improve extraction of the radiation from the device 62. In an embodiment, the covering layer 64 can be formed of any type of encapsulating material, such as an insulating transparent material. For example, the covering layer 64 can comprise a fluoropolymer chosen from a group of ultraviolet transparent polymers or visible epoxy type polymers. In an alternative embodiment, the covering layer 64 can be a group III nitride layer of material, which is included in the group III nitride heterostructure 16. In either case, a top surface of the covering layer 64 can include roughness, be patterned, include a photonic crystal, include imprints (e.g., to form a Fresnel lens or modify optical properties of the surface), and/or the like, which can improve one or more attributes of the light extraction from the device 62.

Additionally, the heterostructure 16 can be etched to expose a top surface of the n-type contact layer 17A for attachment of a contact thereto. A p-type contact 66, which can form an ohmic contact to the p-type contact layer 17D, can be attached to the p-type contact layer 17D and a p-type electrode 68 can be attached to the p-type contact 66. Similarly, an n-type contact 70, which can form an ohmic contact to the n-type contact layer 17A, can be attached to the n-type contact layer 17A and an n-type electrode 72 can be attached to the n-type contact 70. The contacts 66, 70 and the electrodes 68, 72 can be formed of any suitable material (e.g., one or more layers of metal) and can be configured to be reflective or transparent to radiation emitted by the active region 17B.

In an embodiment, the p-type contact 66 includes a material stable at high temperatures (e.g., 500-1000 Celsius), e.g., to prevent p-ohmic degradation, layer inter-diffusion, diffusion to the nitride layers, delamination, and/or the like. For example, an embodiment of the p-type contact 66 can comprise nickel oxide and rhodium layers. In an embodiment, the p-type contact 66 comprises a diffusion barrier conductive metallic layer (e.g., titanium/molybdenum (Ti/Mo), nickel, tungsten, indium tin oxide (ITO), and/or the like) deposited over a p-type ohmic metallic layer. Additionally, the p-type contact 66 can comprise a top layer metallic layer of, for example, gold.

As further shown with respect to the optoelectronic device 62, the device 62 can be mounted to a submount 40 via the electrodes 68, 70. The electrodes 68, 72 can both be attached (e.g., soldered) to the submount 40 via contact pads 74, 76, respectively. The submount 40 can have a thermal conductivity magnitude of at least the thermal conductivity of the last semiconductor layer in the heterostructure 16 (e.g., the p-type contact layer 17D). In an illustrative embodiment, the submount 40 can be formed of aluminum nitride (AlN), silicon carbide (SiC), and/or the like. To this extent, the submount 40 can comprise a thermally conductive material having a thickness and mechanical strength that are sufficient for using the submount 40 to transfer the semiconductor heterostructure that results after the lift-off process is complete. In an embodiment, the submount 40 can be bonded to the optoelectronic device 62 via soldering. For example, the soldering can use a solder material with fine grains (e.g., silver epoxy) or an amorphous soldering alloy, such as a gold tin alloy.

While the device 62 is shown having a flip-chip configuration, it is understood that a device described herein can have any suitable configuration. For example, in an alternative embodiment, the heterostructure 16 can be implemented in a vertical device configuration. In this case, an n-type contact can be formed on an exposed surface 19A of the n-type contact layer 17A and a p-type contact can be formed on an exposed surface 19B of the p-type contact layer 17D without etching the heterostructure 16. As one of the n-type contact layer 17A or the p-type contact layer 17D is grown directly on a sacrificial layer described herein, the formation of the corresponding contact can be performed after the lift-off has been completed.

In either configuration, at least a portion of a surface to which an electrode 68, 70 is attached can remain uncovered by the corresponding electrode. In this case, one or more of the uncovered surfaces of the contact layers 17A, 17D can be configured to improve light extraction there through. For example, the surface can be roughened or patterned as described herein. In an alternative embodiment, one or more of the uncovered surfaces of the contact layers 17A, 17D can be covered with a reflective layer of material to direct the radiation toward an emitting surface. In either case, the transparent or reflective material can be diffusively transparent or diffusively reflective, respectively.

In an embodiment, some or all of the additional processing is performed prior to performing the lift-off process described herein. For example, the p-type contact 66 and/or p-type electrode 68 can be formed on the p-type contact layer 17D of the heterostructure 16. Additionally, following formation of the p-type contact 66, a conducting holding submount can be deposited, which can serve a dual function of processing the semiconductor films during lift-off and subsequent operation as the p-type electrode 68. It is understood that the p-type contact 66 can be deposited and annealed prior to bonding to the conducting holding submount, where the bonding can comprise soldering with an appropriate soldering alloy.

When the n-type contact is fabricated on the surface 19A exposed by the lift-off process, the surface 19A can be configured to improve the n-type contact properties. For example, the n-type contact layer 17A can comprise an n-type AlGaN layer, which can have a high n-type doping in the vicinity of the exposed surface 19A. Such n-type doping can comprise, for example, silicon doping with a dopant concentration of at least $10^{19} 1/cm^3$.

Figure 20:
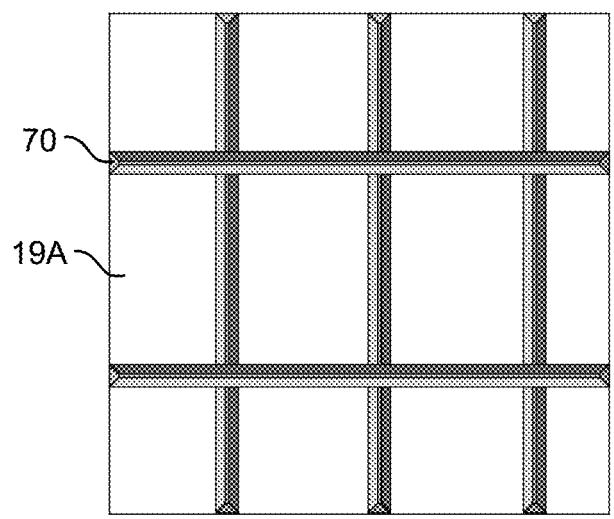
FIG. 20 shows an illustrative contact formed on an exposed surface of a contact layer according to an embodiment.

FIG. 20 shows an illustrative n-type contact 70 formed on an exposed surface 19A of an n-type contact layer according to an embodiment. As illustrated, the n-type contact 70 can form a mesh structure on the surface 19A. One or more attributes of the mesh structure can be configured based on one or more optical and/or electrical properties of the corresponding optoelectronic device. Such attributes can include a width of the mesh lines, a separation distance between adjacent mesh lines, a number of mesh lines, orientations of the mesh lines, locations of the mesh lines, and/or the like. Illustrative properties include device efficiency, device reliability, or a metric that incorporates two or more of these characteristics.

The surface 19A can undergo various processing after being exposed, e.g., after lift-off. For example, the surface 19A can be processed to form a surface roughness, e.g., using wet etching or the like, which can improve light extraction from the device. Regions of the surface 19A on which the n-type contact 70 is to be applied can be protected during etching using, for example, a mask. In an embodiment, the surface 19A of the n-type contact layer is patterned prior to deposition of the n-type contact 70. For example, the pattern can create valleys into which the mesh lines are deposited.

The n-type ohmic properties of the n-type contact 70 can be improved via annealing. To this extent, in an embodiment, the n-type contact 70 can be annealed with a laser beam. The laser beam can create localized heating at the n-type contact 70. In an embodiment, the laser beam creates localized temperatures of at least 500 degrees Celsius. Attributes of the laser beam, such as an intensity and focus, can be selected so as not to damage the p-type contact, soldering layers, as well as the semiconductor heterostructure. To this extent, the annealing laser can utilize laser pulses having sufficiently short durations so to not result in a p-type contact temperature that is higher than the temperature used for annealing the p-type contact. In an embodiment, the intensity of the annealing laser beam is less than the intensity used for laser liftoff. In an embodiment, the laser beam is focused at the n-type metal contact regions 70 and does not penetrate the semiconductor heterostructure. While the mesh contact is shown and described in conjunction with an n-type contact, it is understood that the configuration can be used in conjunction with formation of a p-type contact.

In an embodiment, a group III nitride heterostructure 16 described herein can include one or more attributes configured to prevent a laser from damaging one or more layers in the heterostructure, such as the active layer, and/or one or more components of the corresponding device, such as a p-type contact. For example, the group III nitride heterostructure 16 can comprise a layer with one or more attributes configured to scatter the laser radiation.

Figure 21:
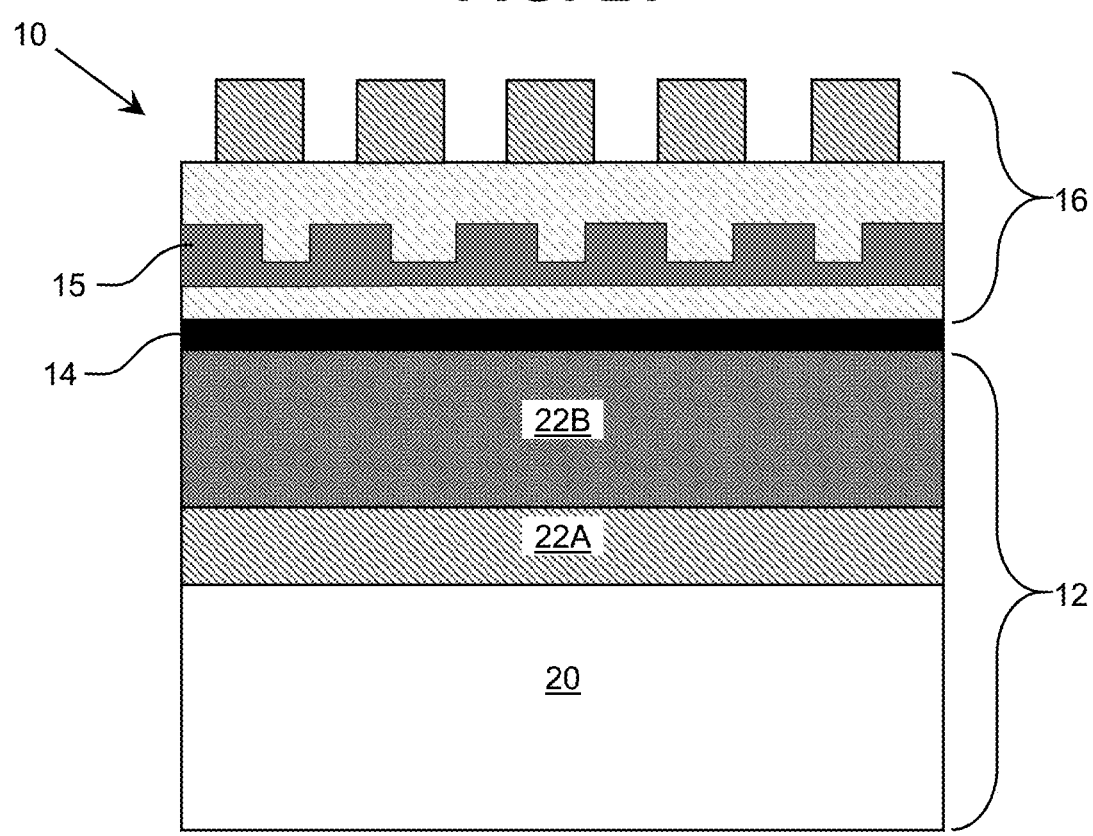
FIG. 21 shows an illustrative growth structure according to an embodiment.

To this extent, FIG. 21 shows an illustrative growth structure 10 according to an embodiment. In this case, the group III nitride heterostructure 16 includes a scattering region 15. In an embodiment, the scattering region 15 comprises an epitaxial layer with patterning and/or compositional fluctuations, which are designed to protect the structure located above the scattering region 15, on the side opposite the sacrificial layer 14, by scattering the laser radiation away from the structure. In an embodiment, the protected structure includes the active layer of the group III nitride heterostructure 16.

As illustrated, the scattering region 15 can include a layer patterned with resulting hills and valleys. Epitaxial overgrowth of a subsequent layer of the group III nitride heterostructure 16, such as an n-type layer, can result in the semiconductor layers having a laterally inhomogeneous compositions. In particular, due to different diffusion rate of Ga and Al atoms, the Ga atoms tend to concentrate in valleys of the patterning, resulting in higher Ga molar fraction in these regions. The regions with a higher Ga molar fraction can be more readily n-type doped, thereby resulting in lateral fluctuation in conductivity and light transmission of the n-type layer. In an embodiment, the n-type contact, such as the contact shown in FIG. 20, is deposited adjacent to the regions having the higher Ga molar fraction. In this case, the n-type contact conductivity can be improved, while reducing shadowing due to n-type contact deposition.

A patterned layer is only illustrative of various solutions for scattering the laser radiation that can be implemented in a group III nitride heterostructure 16 described herein. For example, a scattering region 15 can include a semiconductor layer with laterally varying composition. The variation in composition can be configured to result in a band gap variation that is at least thermal energy and result in variation of the index of refraction of the semiconductor layer of at least one tenth of a percent. In general, the domains have to be comparable or larger than a wavelength of the laser for scattering to take place. In an embodiment, the variation can occur over domains having a characteristic size of at least a wavelength of the laser up to a micron. The variation can create a variable index of refraction of the inhomogeneous layer, as well as interfaces between materials of different indexes of refraction presented at the domain boundaries, each of which can cause scattering. Additionally, the scattering region 15 can include masking domains to prevent the laser from penetrating further into the group III nitride heterostructure 16. Such masking domains can comprise a group III nitride semiconductor layer with a lower bandgap and can, for example, incorporate indium.

While certain features described herein are only illustrated in one or a subset of drawings, it is understood that embodiments described herein can include any combination of two or more of such features. To this extent, the drawings should not be interpreted as providing mutually exclusive embodiments of the invention described herein.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 22:
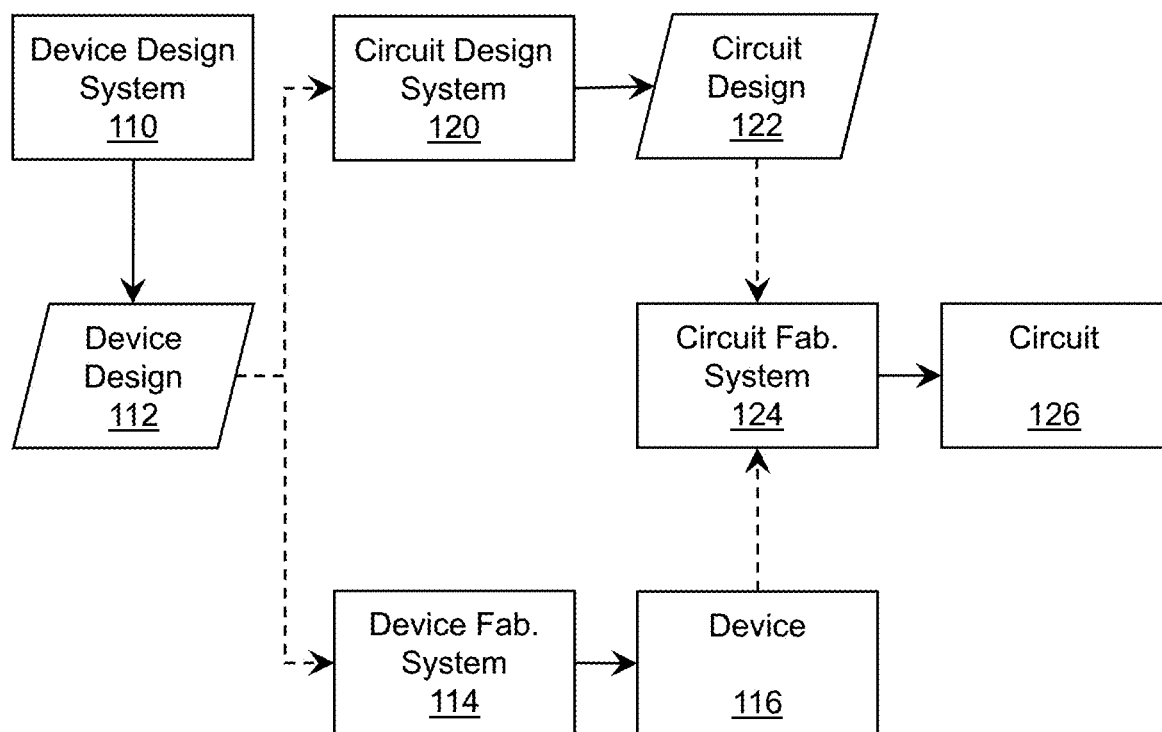
FIG. 22 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 22 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a group III nitride heterostructure, the method comprising:
    epitaxially growing a sacrificial layer over a substrate structure, wherein the substrate structure includes a substrate and a set of group III nitride layers directly on the substrate, wherein the sacrificial layer is grown directly on a surface of a group III nitride layer in the set of group III nitride layers, and wherein each of the set of group III nitride layers in the substrate structure have an aluminum molar fraction of at least 0.5, and wherein the sacrificial layer includes a plurality of columns, the plurality of columns including a plurality of sub-layers, each of the plurality of columns spaced from adjacent columns of the plurality of columns, each sub-layer formed of a different material from an immediately adjacent sub-layer of the plurality of sub-layers and at least one sub-layer in the plurality of sub-layers is gallium nitride;
    epitaxially growing the group III nitride heterostructure directly on the sacrificial layer; and
    decomposing the sacrificial layer by irradiating the sacrificial layer with a laser through the substrate structure to at least partially release the group III nitride heterostructure from the substrate structure, wherein the sacrificial layer is configured to result in absorption of the irradiated laser light at least an order of magnitude higher than any of the set of group III nitride layers in the substrate structure.

2. The method of claim 1, wherein a size of a laser beam generated by the laser is smaller than a lateral area of the group III nitride heterostructure.

3. The method of claim 1, wherein a first group III nitride layer in the group III nitride heterostructure immediately adjacent to the sacrificial layer includes n-type doping, and wherein the method further includes forming an n-type electrode on a surface of the first group III nitride layer after the decomposing.

4. The method of claim 1, further comprising etching the sacrificial layer with hydrofluoric acid, wherein the etching and the decomposing fully release the group III nitride heterostructure from the substrate structure.

5. The method of claim 1, further comprising patterning a surface of the substrate structure prior to growing the sacrificial layer directly on the surface.

6. The method of claim 1, further comprising thinning the substrate in the substrate structure prior to the decomposing.

7. A method of fabricating a group III nitride heterostructure, the method comprising:
    epitaxially growing a sacrificial layer over a substrate structure, wherein the substrate structure includes a substrate and a set of group III nitride layers directly on the substrate, wherein the sacrificial layer is grown directly on a surface of a group III nitride layer in the set of group III nitride layers, wherein the sacrificial layer is gallium nitride, and wherein each of the set of group III nitride layers in the substrate structure have an aluminum molar fraction of at least 0.5;
    epitaxially growing the group III nitride heterostructure directly on the sacrificial layer;
    etching the sacrificial layer with hydrofluoric acid; and
    decomposing the sacrificial layer by irradiating the sacrificial layer with a laser through the substrate structure, wherein the etching and the decomposing fully release the group III nitride heterostructure from the substrate structure, wherein the sacrificial layer is configured to result in absorption of the irradiated laser light at least an order of magnitude higher than any of the set of group III nitride layers in the substrate structure.

8. The method of claim 7, wherein a size of a laser beam generated by the laser is smaller than a lateral area of the group III nitride heterostructure.

9. The method of claim 7, wherein a first group III nitride layer in the group III nitride heterostructure immediately adjacent to the sacrificial layer includes n-type doping, and wherein the method further includes forming an n-type electrode on a surface of the first group III nitride layer after the decomposing.

10. The method of claim 7, further comprising patterning a surface of the substrate structure prior to growing the sacrificial layer directly on the surface.

11. The method of claim 7, wherein the sacrificial layer includes a plurality of columns, the plurality of columns including a plurality of sub-layers.

12. The method of claim 7, further comprising thinning the substrate in the substrate structure prior to the decomposing.

* * * * *